United States Patent
Reilly et al.

(10) Patent No.: US 9,847,222 B2
(45) Date of Patent: Dec. 19, 2017

(54) TREATMENT FOR FLOWABLE DIELECTRIC DEPOSITION ON SUBSTRATE SURFACES

(71) Applicant: Lam Research Corporation, Fremont, CA (US)

(72) Inventors: Patrick Reilly, Dublin, CA (US); Harald te Nijenhuis, San Jose, CA (US); Nerissa Draeger, Fremont, CA (US); Bart J. van Schravendijk, Palo Alto, CA (US); Nicholas Muga Ndiege, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 52 days.

(21) Appl. No.: 14/519,400

(22) Filed: Oct. 21, 2014

(65) Prior Publication Data

US 2015/0118862 A1    Apr. 30, 2015

Related U.S. Application Data

(60) Provisional application No. 61/895,676, filed on Oct. 25, 2013.

(51) Int. Cl.
*H01L 21/02* (2006.01)
*C23C 16/02* (2006.01)
(Continued)

(52) U.S. Cl.
CPC ...... *H01L 21/02271* (2013.01); *C23C 16/02* (2013.01); *C23C 16/401* (2013.01);
(Continued)

(58) Field of Classification Search
CPC ......... H01L 21/02274; H01L 21/02299; H01L 21/02301; H01L 21/02312;
(Continued)

(56) References Cited

U.S. PATENT DOCUMENTS

| 4,099,990 A | 7/1978 | Brown et al. |
| 4,740,480 A | 4/1988 | Ooka |

(Continued)

FOREIGN PATENT DOCUMENTS

| CN | 1655330 A | 8/2005 |
| CN | 1722403 A | 1/2006 |

(Continued)

OTHER PUBLICATIONS

U.S. Appl. No. 14/464,071, filed Aug. 20, 2014, entitled "Flowable Dielectric for Selective Ultra Low-K Pore Sealing."

(Continued)

*Primary Examiner* — Fernando L Toledo
*Assistant Examiner* — Adam S Bowen
(74) *Attorney, Agent, or Firm* — Weaver Austin Villeneuve & Sampson LLP

(57) ABSTRACT

Provided herein are methods and apparatus for improved flowable dielectric deposition on substrate surfaces. The methods involve improving nucleation and wetting on the substrate surface without forming a thick high wet etch rate interface layer. According to various embodiments, the methods may include single or multi-stage remote plasma treatments of a deposition surface. In some embodiments, a treatment may include exposure to both a reducing chemistry and a hydrogen-containing oxidizing chemistry. Apparatus for performing the methods are also provided.

21 Claims, 11 Drawing Sheets

(51) Int. Cl.

| | |
|---|---|
| *C23C 16/40* | (2006.01) |
| *C23C 16/452* | (2006.01) |
| *C23C 16/455* | (2006.01) |
| *C23C 16/505* | (2006.01) |
| *C23C 16/56* | (2006.01) |
| *H01L 21/768* | (2006.01) |
| *H01L 21/67* | (2006.01) |
| *H01L 21/762* | (2006.01) |

(52) U.S. Cl.
CPC ...... *C23C 16/452* (2013.01); *C23C 16/45512* (2013.01); *C23C 16/505* (2013.01); *C23C 16/56* (2013.01); *H01L 21/02164* (2013.01); *H01L 21/02315* (2013.01); *H01L 21/67207* (2013.01); *H01L 21/76224* (2013.01); *H01L 21/76814* (2013.01); *H01L 21/76826* (2013.01); *H01L 21/76831* (2013.01); *H01L 21/76837* (2013.01)

(58) Field of Classification Search
CPC ......... H01L 21/02315; H01L 21/02271; H01L 21/76224; H01L 21/67207; H01L 21/76814; H01L 21/76826; H01L 21/76831; H01L 21/76837; H01L 21/02164; C23C 16/505; C23C 16/56; C23C 16/02; C23C 16/452
USPC ........................................................ 438/778
See application file for complete search history.

(56) References Cited

U.S. PATENT DOCUMENTS

| | | | |
|---|---|---|---|
| 4,923,720 A | 5/1990 | Lee et al. | |
| 5,281,274 A | 1/1994 | Yoder | |
| 5,320,983 A | 6/1994 | Ouellet | |
| 5,382,311 A | 1/1995 | Ishikawa et al. | |
| 5,387,546 A | 2/1995 | Maeda et al. | |
| 5,462,603 A | 10/1995 | Murakami | |
| 5,516,721 A | 5/1996 | Galli et al. | |
| 5,525,157 A | 6/1996 | Hawkins et al. | |
| 5,534,731 A | 7/1996 | Cheung | |
| 5,558,717 A | 9/1996 | Zhao et al. | |
| 5,747,381 A | 5/1998 | Wu et al. | |
| 5,753,886 A | 5/1998 | Iwamura et al. | |
| 5,775,808 A | 7/1998 | Pan | |
| 5,796,074 A | 8/1998 | Edelstein et al. | |
| 5,807,785 A | 9/1998 | Ravi | |
| 5,840,631 A | 11/1998 | Kubo et al. | |
| 5,858,880 A | 1/1999 | Dobson et al. | |
| 5,874,367 A | 2/1999 | Dobson | |
| 5,879,574 A | 3/1999 | Sivaramakrishnan et al. | |
| 5,899,751 A | 5/1999 | Chang et al. | |
| 5,902,127 A | 5/1999 | Park | |
| 5,903,428 A | 5/1999 | Grimard et al. | |
| 5,911,833 A | 6/1999 | Denison et al. | |
| 5,932,289 A | 8/1999 | Dobson et al. | |
| 5,970,383 A | 10/1999 | Lee | |
| 5,990,013 A | 11/1999 | Berenguer et al. | |
| 6,001,183 A | 12/1999 | Gurary et al. | |
| 6,013,581 A | 1/2000 | Wu et al. | |
| 6,035,101 A | 3/2000 | Sajoto et al. | |
| 6,054,379 A | 4/2000 | Yau et al. | |
| 6,060,384 A | 5/2000 | Chen et al. | |
| 6,072,227 A | 6/2000 | Yau et al. | |
| 6,114,224 A | 9/2000 | Ngo et al. | |
| 6,114,259 A | 9/2000 | Sukharev et al. | |
| 6,143,626 A | 11/2000 | Yabu et al. | |
| 6,207,535 B1 | 3/2001 | Lee et al. | |
| 6,218,268 B1 | 4/2001 | Xia et al. | |
| 6,235,146 B1 | 5/2001 | Kadotani et al. | |
| 6,242,366 B1 | 6/2001 | Beekman et al. | |
| 6,251,759 B1 | 6/2001 | Guo et al. | |
| 6,287,989 B1 | 9/2001 | Dobson | |
| 6,300,219 B1 | 10/2001 | Doan et al. | |
| 6,309,933 B1 | 10/2001 | Li et al. | |
| 6,323,123 B1 | 11/2001 | Liu et al. | |
| 6,383,951 B1 | 5/2002 | Li | |
| 6,399,213 B2 | 6/2002 | Shiokawa | |
| 6,413,583 B1 | 7/2002 | Moghadam et al. | |
| 6,439,244 B1 | 8/2002 | Wu | |
| 6,448,187 B2 | 9/2002 | Yau et al. | |
| 6,475,564 B1 | 11/2002 | Carter et al. | |
| 6,544,858 B1 | 4/2003 | Beekman et al. | |
| 6,605,955 B1 | 8/2003 | Costello et al. | |
| 6,613,695 B2 * | 9/2003 | Pomarede ........... C23C 16/0218 257/E21.191 |
| 6,635,586 B2 | 10/2003 | Goo et al. | |
| 6,640,840 B1 | 11/2003 | MacNeil | |
| 6,653,247 B2 | 11/2003 | MacNeil | |
| 6,660,663 B1 | 12/2003 | Cheung et al. | |
| 6,740,853 B1 | 5/2004 | Johnson et al. | |
| 6,743,436 B1 | 6/2004 | Lee | |
| 6,743,736 B2 | 6/2004 | Mardian et al. | |
| 6,787,463 B2 | 9/2004 | Mardian et al. | |
| 6,790,737 B2 | 9/2004 | Schneegans et al. | |
| 6,812,135 B2 | 11/2004 | Li et al. | |
| 6,828,162 B1 | 12/2004 | Halliyal et al. | |
| 6,846,757 B2 | 1/2005 | MacNeil | |
| 6,858,195 B2 | 2/2005 | Aronowitz et al. | |
| 6,902,947 B2 | 6/2005 | Chinn et al. | |
| 6,972,262 B2 | 12/2005 | Lee et al. | |
| 6,984,561 B2 | 1/2006 | Herner et al. | |
| 6,995,056 B2 | 2/2006 | Lee et al. | |
| 7,033,945 B2 | 4/2006 | Byun et al. | |
| 7,056,560 B2 | 6/2006 | Yim et al. | |
| 7,071,126 B2 | 7/2006 | Johnston et al. | |
| 7,074,690 B1 | 7/2006 | Gauri et al. | |
| 7,074,727 B2 | 7/2006 | Hsu et al. | |
| 7,084,505 B2 | 8/2006 | Hamada et al. | |
| 7,091,453 B2 | 8/2006 | Murayama et al. | |
| 7,153,783 B2 | 12/2006 | Lu et al. | |
| 7,211,525 B1 | 5/2007 | Shanker et al. | |
| 7,235,137 B2 | 6/2007 | Kitayama et al. | |
| 7,238,604 B2 | 7/2007 | Kloster et al. | |
| 7,271,112 B1 | 9/2007 | Papasouliotis et al. | |
| 7,311,782 B2 | 12/2007 | Strang et al. | |
| 7,365,000 B2 | 4/2008 | Lee et al. | |
| 7,480,129 B2 | 1/2009 | Brown et al. | |
| 7,498,273 B2 | 3/2009 | Mallick et al. | |
| 7,521,378 B2 | 4/2009 | Fucsko et al. | |
| 7,524,735 B1 | 4/2009 | Gauri et al. | |
| 7,575,633 B2 | 8/2009 | Romanin | |
| 7,582,555 B1 | 9/2009 | Lang et al. | |
| 7,585,704 B2 | 9/2009 | Belyansky et al. | |
| 7,589,012 B1 | 9/2009 | Seo et al. | |
| 7,622,369 B1 | 11/2009 | Lee et al. | |
| 7,629,227 B1 | 12/2009 | Wang et al. | |
| 7,648,927 B2 | 1/2010 | Singh et al. | |
| 7,655,532 B1 | 2/2010 | Chen et al. | |
| 7,670,436 B2 | 3/2010 | Miller et al. | |
| 7,727,906 B1 | 6/2010 | Shanker et al. | |
| 7,794,544 B2 | 9/2010 | Nguyen et al. | |
| 7,804,130 B1 | 9/2010 | Fung | |
| 7,825,044 B2 | 11/2010 | Mallick et al. | |
| 7,888,233 B1 | 2/2011 | Gauri et al. | |
| 7,888,273 B1 | 2/2011 | Wang et al. | |
| 7,915,139 B1 | 3/2011 | Lang et al. | |
| 7,947,551 B1 | 5/2011 | Syue et al. | |
| 7,999,356 B2 | 8/2011 | Nakasaki et al. | |
| 8,178,159 B2 | 5/2012 | Baikerikar et al. | |
| 8,187,951 B1 | 5/2012 | Wang et al. | |
| 8,278,224 B1 | 10/2012 | Mui et al. | |
| 8,481,403 B1 | 7/2013 | Gauri et al. | |
| 8,557,712 B1 | 10/2013 | Antonelli et al. | |
| 8,580,697 B1 | 11/2013 | Lang et al. | |
| 8,664,287 B2 | 3/2014 | Shukla | |
| 8,685,867 B1 | 4/2014 | Danek et al. | |
| 8,728,958 B2 | 5/2014 | Ashtiani et al. | |
| 8,809,161 B2 | 8/2014 | Gauri et al. | |
| 8,846,536 B2 | 9/2014 | Draeger et al. | |
| 9,064,684 B1 * | 6/2015 | Mui .................. C23C 16/44 |
| 9,224,594 B2 * | 12/2015 | Kashefi ............ H01L 21/02304 |

(56) References Cited

U.S. PATENT DOCUMENTS

| | | | |
|---|---|---|---|
| 9,245,739 B2 | 1/2016 | Ndiege et al. | |
| 9,257,302 B1 | 2/2016 | Wang et al. | |
| 9,299,559 B2 | 3/2016 | Draeger et al. | |
| 2002/0006729 A1 | 1/2002 | Geiger et al. | |
| 2002/0007785 A1 | 1/2002 | Gujer et al. | |
| 2002/0050246 A1 | 5/2002 | Parkhe | |
| 2002/0066726 A1 | 6/2002 | Cole et al. | |
| 2002/0076490 A1 | 6/2002 | Chiang et al. | |
| 2002/0098627 A1* | 7/2002 | Pomarede | C23C 16/0218 438/149 |
| 2003/0040199 A1 | 2/2003 | Agarwal | |
| 2003/0066482 A1 | 4/2003 | Pokharna et al. | |
| 2003/0077887 A1 | 4/2003 | Jang et al. | |
| 2003/0121898 A1 | 7/2003 | Kane et al. | |
| 2003/0124870 A1 | 7/2003 | Macneil et al. | |
| 2003/0146416 A1 | 8/2003 | Takei et al. | |
| 2003/0159655 A1 | 8/2003 | Lin et al. | |
| 2003/0194861 A1 | 10/2003 | Mardian et al. | |
| 2003/0207580 A1 | 11/2003 | Li et al. | |
| 2003/0210065 A1 | 11/2003 | Lu et al. | |
| 2004/0033639 A1* | 2/2004 | Chinn | B81B 3/0005 438/59 |
| 2004/0048455 A1 | 3/2004 | Karasawa et al. | |
| 2004/0152342 A1 | 8/2004 | Li et al. | |
| 2004/0169005 A1 | 9/2004 | Kim et al. | |
| 2004/0224496 A1 | 11/2004 | Cui et al. | |
| 2005/0020074 A1 | 1/2005 | Kloster et al. | |
| 2005/0020093 A1* | 1/2005 | Ahn | H01L 21/02063 438/782 |
| 2005/0026443 A1 | 2/2005 | Goo et al. | |
| 2005/0064698 A1 | 3/2005 | Chang et al. | |
| 2005/0112282 A1 | 5/2005 | Gordon | |
| 2005/0136684 A1 | 6/2005 | Mukai et al. | |
| 2005/0150453 A1 | 7/2005 | Simmons et al. | |
| 2005/0181566 A1 | 8/2005 | Machida et al. | |
| 2005/0191863 A1 | 9/2005 | Olmer et al. | |
| 2005/0212179 A1 | 9/2005 | Honda et al. | |
| 2005/0229849 A1 | 10/2005 | Silvetti et al. | |
| 2005/0258542 A1 | 11/2005 | Fuller et al. | |
| 2005/0260864 A1 | 11/2005 | Huang et al. | |
| 2006/0014384 A1 | 1/2006 | Lee et al. | |
| 2006/0024912 A1 | 2/2006 | Lee | |
| 2006/0172531 A1 | 8/2006 | Lin et al. | |
| 2006/0172552 A1 | 8/2006 | Ajmera et al. | |
| 2006/0183345 A1 | 8/2006 | Nguyen et al. | |
| 2006/0216946 A1 | 9/2006 | Usami et al. | |
| 2006/0223290 A1 | 10/2006 | Belyansky et al. | |
| 2006/0269693 A1 | 11/2006 | Balseanu et al. | |
| 2006/0270217 A1 | 11/2006 | Balseanu et al. | |
| 2007/0054505 A1 | 3/2007 | Antonelli et al. | |
| 2007/0224777 A1 | 9/2007 | Hamelin | |
| 2007/0256785 A1 | 11/2007 | Pamarthy et al. | |
| 2007/0258186 A1 | 11/2007 | Matyushkin et al. | |
| 2007/0277734 A1 | 12/2007 | Lubomirsky et al. | |
| 2007/0281495 A1 | 12/2007 | Mallick et al. | |
| 2007/0296035 A1 | 12/2007 | George et al. | |
| 2007/0298585 A1 | 12/2007 | Lubomirsky et al. | |
| 2008/0020591 A1 | 1/2008 | Balseanu et al. | |
| 2008/0054466 A1 | 3/2008 | Nasu et al. | |
| 2008/0066682 A1 | 3/2008 | Yamashita | |
| 2008/0081434 A1 | 4/2008 | Nam et al. | |
| 2008/0089001 A1 | 4/2008 | Parkhe et al. | |
| 2008/0132087 A1 | 6/2008 | Xia et al. | |
| 2008/0199977 A1 | 8/2008 | Weigel et al. | |
| 2008/0274626 A1* | 11/2008 | Glowacki | C23C 16/0272 438/787 |
| 2008/0295872 A1 | 12/2008 | Riker et al. | |
| 2008/0318439 A1 | 12/2008 | Ito et al. | |
| 2009/0020847 A1 | 1/2009 | Byun et al. | |
| 2009/0053895 A1 | 2/2009 | Oshima et al. | |
| 2009/0061647 A1 | 3/2009 | Mallick et al. | |
| 2009/0104789 A1 | 4/2009 | Mallick et al. | |
| 2009/0104790 A1 | 4/2009 | Liang | |
| 2009/0159566 A1 | 6/2009 | Brillhart et al. | |
| 2009/0159587 A1 | 6/2009 | Shimanuki et al. | |
| 2009/0190908 A1 | 7/2009 | Shibagaki | |
| 2009/0215282 A1 | 8/2009 | Moore et al. | |
| 2009/0298257 A1 | 12/2009 | Lee et al. | |
| 2009/0321936 A1 | 12/2009 | Kojima et al. | |
| 2010/0000684 A1 | 1/2010 | Choi | |
| 2010/0109155 A1 | 5/2010 | Liu et al. | |
| 2010/0167533 A1 | 7/2010 | Lim et al. | |
| 2011/0020955 A1 | 1/2011 | DeYoung | |
| 2011/0081782 A1 | 4/2011 | Liang et al. | |
| 2011/0151678 A1 | 6/2011 | Ashtiani et al. | |
| 2012/0149213 A1* | 6/2012 | Nittala | C23C 16/02 438/783 |
| 2012/0161405 A1* | 6/2012 | Mohn | C23C 16/401 279/142 |
| 2012/0164328 A1 | 6/2012 | Kojima et al. | |
| 2012/0213940 A1* | 8/2012 | Mallick | C23C 16/345 427/535 |
| 2013/0122718 A1 | 5/2013 | Kato et al. | |
| 2013/0230987 A1* | 9/2013 | Draeger | H01L 21/02126 438/694 |
| 2014/0017904 A1 | 1/2014 | Gauri et al. | |
| 2014/0150647 A1 | 6/2014 | Ahn et al. | |
| 2014/0302689 A1 | 10/2014 | Ashtiani et al. | |
| 2015/0004806 A1 | 1/2015 | Ndiege et al. | |
| 2015/0044882 A1 | 2/2015 | Draeger et al. | |
| 2015/0118863 A1 | 4/2015 | Rathod et al. | |
| 2016/0056071 A1 | 2/2016 | Draeger et al. | |
| 2017/0137943 A1 | 5/2017 | Mohn et al. | |
| 2017/0140931 A1 | 5/2017 | Van Cleemput et al. | |

FOREIGN PATENT DOCUMENTS

| | | |
|---|---|---|
| CN | 101079391 A | 11/2007 |
| EP | 1 063 692 A1 | 12/2000 |
| EP | 0 819 780 B1 | 2/2004 |
| JP | 2001-148382 | 5/2001 |
| JP | 2010-153859 | 7/2010 |
| KR | 10-2006-0005476 A | 1/2006 |
| KR | 10-2007-0104591 A | 10/2007 |
| KR | 10-2009-0040867 A | 4/2009 |
| TW | 380286 | 1/2000 |
| WO | WO 99/22043 A1 | 5/1999 |
| WO | WO 03/021642 | 3/2003 |
| WO | WO 2007/140376 | 12/2007 |
| WO | WO 2007/140424 | 12/2007 |
| WO | WO 2011/072143 | 6/2011 |

OTHER PUBLICATIONS

U.S. Appl. No. 14/464,196, filed Aug. 20, 2014, entitled "Low-K Oxide Deposition by Hydrolysis and Condensation."

U.S. Appl. No. 13/461,287, filed May 1, 2012, entitled "CVD Flowable Gap Fill".

U.S. Appl. No. 12/986,070, filed Jan. 6, 2011, entitled "Density Gradient-Free Gap Fill".

U.S. Appl. No. 14/519,712, filed Oct. 21, 2014, entitled "Methods and Apparatus for Forming Flowable Dielectric Films Having Low Porosity".

U.S. Appl. No. 14/249,272, filed Apr. 9, 2014, entitled "Methods and Apparatus for Dielectric Deposition."

U.S. Appl. No. 14/466,222, filed Aug. 22, 2014, entitled "Flowable Oxide Film With Tunable Wet Etch Rate".

U.S. Office Action, dated Aug. 23, 2005, issued in U.S. Appl. No. 10/810,066.

U.S. Notice of Allowance and Fee Due, dated Feb. 15, 2006, issued in U.S. Appl. No. 10/810,066.

U.S. Office Action, dated Jun. 27, 2008, issued in U.S. Appl. No. 11/447,594.

U.S. Notice of Allowance and Fee Due, dated Dec. 11, 2008, issued in U.S. Appl. No. 11/447,594.

U.S. Office Action, dated May 24, 2010, issued in U.S. Appl. No. 12/411,243.

U.S. Final Office Action, dated Sep. 13, 2010, issued in U.S. Appl. No. 12/411,243.

U.S. Notice of Allowance, dated Oct. 6, 2010, issued in U.S. Appl. No. 12/411,243.

(56) References Cited

OTHER PUBLICATIONS

U.S. Office Action, dated May 18, 2012, issued in U.S. Appl. No. 12/984,524.
U.S. Final Office Action, dated Sep. 14, 2012, issued in U.S. Appl. No. 12/984,524.
U.S. Notice of Allowance, dated Mar. 7, 2013, issued in U.S. Appl. No. 12/984,524.
U.S. Office Action, dated Dec. 16, 2013, issued in U.S. Appl. No. 13/935,398.
U.S. Notice of Allowance, dated Apr. 11, 2014, issued in U.S. Appl. No. 13/935,398.
U.S. Office Action, dated Oct. 26, 2007, issued in U.S. Appl. No. 11/323,812.
U.S. Final Office Action, dated Apr. 9, 2008, issued in U.S. Appl. No. 11/323,812.
U.S. Office Action, dated Oct. 9, 2008, issued in U.S. Appl. No. 11/323,812.
U.S. Notice of Allowance and Fee Due, dated Apr. 23, 2009, issued in U.S. Appl. No. 11/323,812. .
U.S. Notice of Allowance, dated Nov. 18, 2010, issued in U.S. Appl. No. 12/508,461.
U.S. Notice of Allowance, dated Aug. 6, 2012, issued in U.S. Appl. No. 13/031,077.
U.S. Notice of Allowance, dated Jul. 8, 2013, issued in U.S. Appl. No. 13/031,077.
U.S. Office Action, dated Nov. 4, 2008, issued in U.S. Appl. No. 11/925,514.
U.S. Final Office Action, dated Jun. 17, 2009, issued in U.S. Appl. No. 11/925,514.
U.S. Notice of Allowance, dated Jul. 29, 2009, issued in U.S. Appl. No. 11/925,514.
U.S. Office Action, dated Apr. 26, 2011, issued in U.S. Appl. No. 12/625,468.
U.S. Final Office Action, dated Oct. 14, 2011, issued in U.S. Appl. No. 12/625,468.
U.S. Notice of Allowance, dated Jan. 31, 2012, issued in U.S. Appl. No. 12/625,468.
U.S. Office Action, dated Aug. 15, 2013, issued in U.S. Appl. No. 13/461,287.
U.S. Office Action, dated Feb. 28, 2014, issued in U.S. Appl. No. 13/461,287.
U.S. Final Office Action, dated Aug. 26, 2014, issued in U.S. Appl. No. 13/461,287.
U.S. Office Action, dated Nov. 12, 2008, issued in U.S. Appl. No. 11/834,581.
U.S. Final Office Action, dated Aug. 6, 2009, issued in U.S. Appl. No. 11/834,581.
U.S. Office Action dated Dec. 18, 2009, issued in U.S. Appl. No. 11/834,581.
U.S. Final Office Action, dated Apr. 22, 2010, issued in U.S. Appl. No. 11/834,581.
U.S. Notice of Allowance, dated Oct. 7, 2010, issued in U.S. Appl. No. 11/834,581.
U.S. Office Action, dated Feb. 26, 2010, issued in U.S. Appl. No. 12/334,726.
U.S. Final Office Action, dated Oct. 26, 2010, issued in U.S. Appl. No. 12/334,726.
U.S. Office Action, dated Sep. 16, 2011, issued in U.S. Appl. No. 12/334,726.
U.S. Final Office Action, dated Mar. 30, 2012, issued in U.S. Appl. No. 12/334,726.
U.S. Final Office Action, dated Oct. 23, 2012, issued in U.S. Appl. No. 12/334,726.
U.S. Notice of Allowance dated Jun. 10, 2013, issued in U.S. Appl. No. 12/334,726.
U.S. Notice of Allowance, dated May 29, 2012, issued in U.S. Appl. No. 12/566,085.
U.S. Notice of Allowance, dated Jun. 21, 2012, issued in U.S. Appl. No. 12/566,085.
U.S. Office Action, dated Jun. 21, 2013, issued in U.S. Appl. No. 13/607,511.
U.S. Final Office Action, dated Dec. 11, 2013, issued in U.S. Appl. No. 13/607,511.
U.S. Office Action, dated Jul. 25, 2014, issued in U.S. Appl. No. 13/607,511.
U.S. Office Action, dated Dec. 21, 2012, issued in U.S. Appl. No. 12/964,110.
U.S. Final Office Action, dated Sep. 12, 2013, issued in U.S. Appl. No. 12/694,110.
U.S. Notice of Allowance, dated Dec. 27, 2013, issued in U.S. Appl. No. 12/964,110.
U.S. Notice of Allowance, dated Apr. 23, 2014, issued in U.S. Appl. No. 12/964,110.
U.S. Office Action, dated Dec. 6, 2012, issued in U.S. Appl. No. 13/315,123.
U.S. Office Action, dated Jul. 15, 2013, issued in U.S. Appl. No. 13/315,123.
U.S. Notice of Allowance, dated Nov. 8, 2013, issued in U.S. Appl. No. 13/315,123.
U.S. Office Action, dated Nov. 8, 2013, issued in U.S. Appl. No. 13/313,735.
U.S. Final Office Action, dated Jul. 29, 2014, issued in U.S. Appl. No. 13/313,735.
U.S. Office Action, dated Sep. 12, 2013, issued in U.S. Appl. No. 13/493,936.
U.S. Final Office Action, dated Feb. 3, 2014, issued in U.S. Appl. No. 13/493,936.
U.S. Notice of Allowance, dated May 22, 2014, issued in U.S. Appl. No. 13/493,936.
Japanese Office Action dated Sep. 17, 2013 issued in JP2009-282737.
Japanese Office Action dated Jun. 3, 2014 issued in JP2009-282737.
PCT International Search Report and Written Opinion dated Aug. 10, 2011 issued in PCT/US2010/059721.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
Bekiari, V. et al. (1998) "Characterization of Photoluminescence from a Material Made by Interaction of (3-Aminopropyl)triethoxysilane with Acetic Acid," *Langmuir*, 14(13):3459-3461.
Chung, Sung-Woong et al. (Mar. 2004) "Flowable Oxide CVD Process for Shallow Trench Isolation in Silicon Semiconductor," *Journal of Semiconductor Technology and Science*, 4(1):45-51.
Brankova et al. (2003) "Photoluminescence from Sol-Gel Organic/Inorganic Hybrid Gels Obtained through Carboxylic Acid Solvolysis," *Chem. Mater.*, 15(9):1855-1859.
Chung, Sung-Woong, et al. (2002) "Novel Shallow Trench Isolation Process Using Flowable Oxide CVD for sub-100nm DRAM," *IEEE, IEDM*, pp. 233-236.
Fessenden et al. (1961) "The Chemistry of Silicon-Nitrogen Compounds," *Chem. Rev.* 61(4)361-388.
Hatanaka, M., et al. (1991) "$H_2O$-TEOS Plasma-CVD Realizing Dielectrics Having a Smooth Surface," *IEEE*, VMIC Conference, pp. 435-441.
Kessler et al. (2006) "New insight in the role of modifying ligands in the sol-gel processing of metal alkoxide precursors: A possibility to approach new classes of materials," *J. Sol-Gel Sci. Techn.* 40(2-3):163-179.
Matsuura, M., et al. (1994) "Novel Self-Planarizing CVD Oxide for Interlayer Dielectric Applications," *IEEE*, pp. 117-120.
Nakano, M., et al. (1989) "Digital CVD of $SiO_2$," *Extended Abstracts of the 21$^{st}$ Conference on Solid State Devices and Materials*, Tokyo, pp. 49-52.
Noguchi, S. et al. (1987) "Liquid Phase Oxidation Employing O Atoms Produced by Microwave Discharge and $Si(CH_3)_4$," *Extended Abstracts of the 19$^{th}$ Conference on Solid State Devices and Materials*, Tokyo, pp. 451-454.

(56) References Cited

OTHER PUBLICATIONS

Sakaue, H., et al. (1990) "Digital Chemical Vapor Deposition of $SiO_2$ Using a Repetitive Reaction of Triethylsilane /Hydrogen and Oxidation," *Department of Electrical Engineering, Hiroshima University*, pp. L 124-L 127.
Stathatos et al. (Jul. 19, 2003) "Study of Acetic Acid-Catalyzed Nanocomposite Organic/Inorganic Ureasil Sol-Gel Ionic Conductors," Langmuir, 19:(18)7587-7591.
U.S. Office Action, dated Oct. 10, 2014, issued in U.S. Appl. No. 13/313,735.
U.S. Appl. No. 13/607,511, filed Sep. 7, 2012, entitled "Flowable Oxide Deposition Using Rapid Delivery of Process Gases."
U.S. Notice of Allowance, dated Jan. 23, 2015, issued in U.S. Appl. No. 13/607,511.
U.S. Office Action, dated Dec. 9, 2014, issued in U.S. Appl. No. 14/466,222.
Chinese Second Office Action dated Dec. 15, 2014 issued in CN 2010-80055670.3.
Chinese First Office Action and Search Report dated Dec. 18, 2014 issued in CN 201110424193.X.
Chinese First Office Action and Search Report dated Jan. 6, 2015 issued CN 201110442926.2.
U.S. Appl. No. 14/942,703, filed Nov. 16, 2015, entitled "Apparatus for UV Flowable Dielectric."
U.S. Appl. No. 14/942,704, filed Nov. 16, 2015, entitled "Low K Dielectric Deposition via UV Driven Photopolymerization."
U.S. Office Action, dated Jan. 21, 2016, issued in U.S. Appl. No. 14/519,712.
U.S. Office Action, dated Dec. 30, 2015, issued in U.S. Appl. No. 14/464,071.
U.S. Office Action, dated Mar. 25, 2015, issued in U.S. Appl. No. 14/464,196.
U.S. Notice of Allowance, dated Sep. 14, 2015, issued in U.S. Appl. No. 14/464,196.
U.S. Notice of Allowance, dated Apr. 20, 2015, issued in U.S. Appl. No. 13/461,287.
U.S. Notice of Allowance, dated Sep. 10, 2015, issued in U.S. Appl. No. 13/461,287.
U.S. Notice of Allowance [Corrected Notice of Allowability], dated Oct. 22, 2015, issued in U.S. Appl. No. 13/461,287.
U.S. Notice of Allowance [Corrected Notice of Allowability], dated Jan. 11, 2016, issued in U.S. Appl. No. 13/461,287.
U.S. Office Action, dated Apr. 20, 2015, issued in U.S. Appl. No. 13/313,735.
U.S. Office Action, dated Oct. 22, 2015, issued in U.S. Appl. No. 13/313,735.
U.S. Final Office Action, dated Feb. 19, 2016, issued in U.S. Appl. No. 13/313,735.
U.S. Final Office Action, dated Jul. 14, 2015, issued in U.S. Appl. No. 14/466,222.
U.S. Notice of Allowance, dated Oct. 23, 2015, issued in U.S. Appl. No. 14/466,222.
Korean Office Action dated Dec. 27, 2015 issued in KR 10-2009-0124466.
Chinese Third Office Action and Search Report dated Jun. 23, 2015 issued in CN 2010-80055670.3.
Chinese Fourth Office Action dated Mar. 14, 2016 issued in CN 2010-80055670.3.
Taiwan Office Action dated Jun. 12, 2015 issued in TW 099143081.
Taiwan Office Action dated Dec. 10, 2015 issued in TW 099143081.
Chinese Second Office Action and Search Report dated Sep. 14, 2015 issued in CN 201110424193.X.
Chinese Second Office Action and Search Report dated Aug. 25, 2015 issued in CN 201110442926.2.
Taiwan Office Action dated Nov. 20, 2015 issued in TW 100147521.
U.S. Final Office Action, dated Jul. 29, 2016, issued in U.S. Appl. No. 14/519,712.
U.S. Final Office Action, dated Sep. 2, 2016, issued in U.S. Appl. No. 14/464,071.
U.S. Office Action, dated May 6, 2016, issued in U.S. Appl. No. 14/942,704.
U.S. Final Office Action, dated Oct. 19, 2016, issued in U.S. Appl. No. 14/942,704.
U.S. Office Action, dated Jun. 24, 2016, issued in U.S. Appl. No. 14/249,272.
U.S. Office Action, dated Jul. 29, 2016, issued in U.S. Appl. No. 13/329,078.
Korean Office Action dated Jul. 12, 2016 issued in KR 10-2009-0124466.
Taiwan Office Action dated Apr. 20, 2016 issued in TW 100145389.
Weast, (1975) "CRC Handbook of Chemistry and Physics," 56th edition, CRC Press, Cleveland, Ohio, excerpts from F-95 & F-119, 4 pages.
U.S. Office Action, dated May 4, 2017, issued in U.S. Appl. No. 14/519,712.
U.S. Office Action, dated May 11, 2017, issued in U.S. Appl. No. 14/464,071.
U.S. Notice of Allowance, dated Mar. 22, 2017, issued in U.S. Appl. No. 13/329,078.
Korean Office Action dated Nov. 1, 2016 issued in KR 10-2012-7013775.
Taiwan Office Action and Search Report dated Nov. 16, 2016 issued in TW 102107721.
U.S. Appl. No. 12/986,070, filed Jan. 6, 2011, Wang et al.
U.S. Office Action, dated Nov. 25, 2011, issued in U.S. Appl. No. 12/986,070.
U.S. Final Office Action, dated Jun. 25, 2012, issued in U.S. Appl. No. 12/986,070.

\* cited by examiner

903

904

TREATMENT FOR FLOWABLE DIELECTRIC DEPOSITION ON SUBSTRATE SURFACES

CROSS-REFERENCE TO RELATED APPLICATION

This application claims priority to U.S. Provisional Patent Application No. 61/895,676, filed Oct. 25, 2013, which is incorporated by reference herein in its entirety and for all purposes.

BACKGROUND

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

SUMMARY

One aspect of the subject matter disclosed herein may be implemented in a method of treating a substrate surface. The method may be performed prior to depositing a flowable dielectric film on the surface. The method may involve performing a multi-step treatment, the multi-step treatment including a first operation of exposing the substrate surface to plasma species remotely generated from a hydrogen-containing reducing process gas and a second operation of exposing the substrate surface to the plasma species remotely generated from a hydrogen-containing oxidizing process gas. The second operation may be performed after the first operation.

In some embodiments, the methods involve maintaining a substrate temperature of between about −20° C. and 300° C. or between about −20° C. and 100° C. during the treatment. Examples of hydrogen-containing reducing processing gasses include one or more of hydrogen ($H_2$), ammonia ($NH_3$), and hydrazine ($N_2H_2$). In the same or other embodiments, examples of hydrogen-containing oxidizing processing gasses include one or more of water ($H_2O$) and hydrogen peroxide ($H_2O_2$).

In some embodiments, the hydrogen-containing oxidizing process gas includes a mixture of a hydrogen-containing compound and an oxygen-containing compound. In some embodiments, the hydrogen-containing oxidizing process gas includes a compound having one or more hydroxyl (—OH) groups. In some embodiments, the hydrogen-containing oxidizing process gas is a mixture of one or more of $H_2$, $NH_3$, $N_2H_2$ with one or more of oxygen ($O_2$), ozone ($O_3$), $H_2O$, $H_2O_2$, carbon dioxide ($CO_2$), and carbon monoxide (CO). In some embodiments, the hydrogen-containing reducing process gas includes substantially no oxygen. In some embodiments, the primary reactive species in the first operation are hydrogen (H) radicals.

The method may further include exposing the substrate surface to a silicon-containing vapor phase precursor and a co-reactant to thereby deposit a flowable dielectric film on the substrate surface. In some embodiments, the silicon-containing vapor phase precursor includes a silicon (Si)-carbon (C) bond. In some embodiments, the silicon-containing vapor phase precursor includes a silicon-alkyl bond. The deposition may occur in the same or a different chamber as the multi-step treatment. In some embodiments, the substrate is exposed to air between the multi-step treatment and the deposition.

Another aspect of the subject matter disclosed herein may be implemented in a method of treating a substrate surface. The method may be performed prior to depositing a flowable dielectric film on the surface. The method may involve a first operation of exposing the substrate surface to a reducing environment and a second operation of exposing the substrate surface to an oxidizing environment.

Another aspect of the subject matter disclosed herein may be implemented in a method of treating a substrate surface. The method may be performed prior to depositing a flowable dielectric film on the surface. The method exposing the substrate surface to a hydrogen-containing oxidizing environment, wherein the hydrogen-containing oxidizing environment is generated from a process gas including an oxygen-containing oxidizer having an oxidation potential greater than that of water ($H_2O$).

Another aspect of the subject matter disclosed herein may be implemented in a method of treating a silicon-containing surface. The method may be performed prior to depositing a flowable dielectric film on the surface. The method involves treating the silicon-containing surface to thereby reduce a wetting contact angle to less than 20° without forming an oxide interface layer greater than 20 Å thick.

Another aspect of the subject matter disclosed herein may be implemented in an apparatus including a chamber including a substrate support, a plasma generator remote to the chamber, one or more inlets to the plasma generator, a line between the plasma generator and the chamber capable of directing plasma species generated in the plasma generator to the chamber; and a controller having instructions for a first operation of introducing a hydrogen-containing reducing process gas to the plasma generator and directing generated plasma species to the chamber; and a second operation, performed after the first operation, of introducing a hydrogen-containing oxidizing process gas to the plasma generator and directing the plasma species to the chamber.

These and other aspects are discussed further below with reference to the drawings.

DETAILED DESCRIPTION OF THE INVENTION

Introduction

Figure 1:
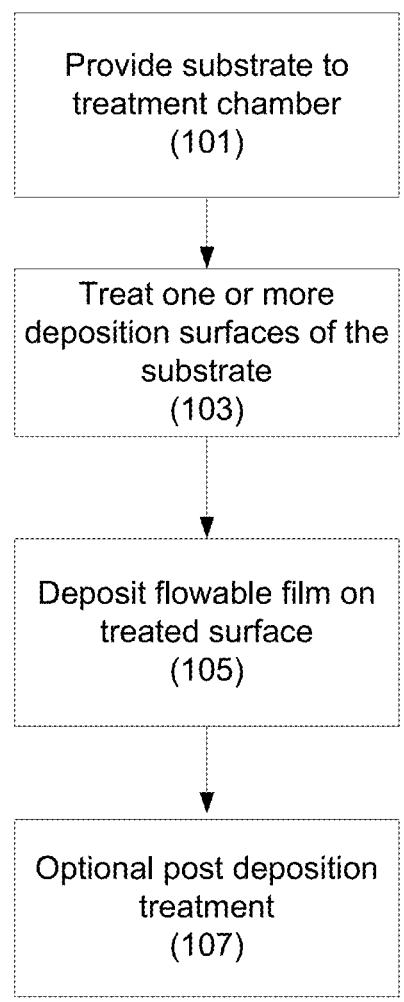
FIG. 1 is a flow diagram illustrating an example of a process for forming a flowable dielectric film involving a pre-treatment operation.

Aspects of the present invention relate to forming flowable dielectric films on substrates. Some embodiments include filling high aspect ratio gaps with insulating material. For ease of discussion, the description below refers chiefly to flowable silicon oxide films, however the processes described herein may also be used with other types of flowable dielectric films. For example, the dielectric film may be primarily silicon nitride, with Si—N and N—H bonds, primarily silicon oxynitride, primarily silicon carbide or primarily silicon oxycarbide films.

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features becomes increasingly difficult due to limitations of existing deposition processes. In certain embodiments, the methods pertain to filling high aspect (AR) ratio (typically at least 6:1, for example 7:1 or higher), narrow width (e.g., sub-50 nm) gaps. In certain embodiments, the methods pertain to filling low AR gaps (e.g., wide trenches). Also in certain embodiments, gaps of varying AR may be on the substrate, with the embodiments directed at filling low and high AR gaps.

In a particular example, a PMD layer is provided between the device level and the first layer of metal in the interconnect level of a partially fabricated integrated circuit. The methods described herein include dielectric deposition in which gaps, (e.g., the gaps between gate conductor stacks) are filled with dielectric material. In another example, the methods are used for shallow trench isolation processes in which trenches are formed in semiconductor substrates to isolate devices. The methods described herein include dielectric deposition in these trenches. The methods can also be used for back end of line (BEOL) applications, in addition to front end of line (FEOL) applications. These can include filling gaps at an interconnect level.

Vapor-phase reactants are introduced to a deposition chamber to deposit the flowable dielectric films. As-deposited, the flowable dielectric films generally have flow characteristics that can provide consistent fill of a gap, though according to various embodiments, they can be used to deposit overburden layers, blanket layers, and other non-gap fill processes as well as to fill gaps. The term "as-deposited flowable dielectric film" refers to a flowable dielectric film prior to any post-deposition treatments, densification, or solidification. An as-deposited flowable dielectric film may be characterized as a soft jelly-like film, a gel having liquid flow characteristics, a liquid film, or a flowable film.

The flowable dielectric deposition methods described herein are not limited to a particular reaction mechanism; the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The term flowable dielectric film can include any dielectric film that is formed from vapor-phase reactants and is flowable as-deposited, including films that have been treated such that they are no longer flowable. In some embodiments, the films may undergo a certain amount of densification during the deposition itself.

The as-deposited films can be treated to physically densify and/or chemically convert the as-deposited film to a desired dielectric material. As used herein, the term "densified flowable dielectric film" refers to a flowable dielectric film that has been physically densified and/or chemically converted to reduce its flowability. In some embodiments, the densified flowable dielectric film may be considered to be solidified. In some embodiments, physically densifying the film can involve shrinking the film; according to various embodiments, a densified flowable dielectric film may or may not be shrunk as compared to the as-deposited dielectric film. In some cases physically densifying the film can involve substituting chemicals in the film, which may result in denser, higher volume films.

An example of a post-deposition treatment is an oxidizing plasma that converts the film to an Si—O network and physically densifies the film. In some embodiments, different operations may be performed for conversion and physical densification. Densification treatments may also be referred to as cures or anneals. A post-deposition treatment may be performed in situ in the deposition module, or ex-situ in another module, or in a combination of both. Further description of post-deposition treatment operations is provided below.

Aspects of the invention relate to treatment of a substrate surface prior to flowable dielectric deposition. The description below provides examples of process sequences in which the treatment methods may be employed. The methods may also be employed in accordance with the flowable deposition processes described in the following: U.S. Pat. Nos. 7,074,690; 7,524,735; 7,582,555; 7,629,227; 7,888,273; 8,278,224 and U.S. patent application Ser. Nos. 12/334,726; 12/964,110; 13/315,123; and 13/493,936, all of which are incorporated by reference herein. The treatments described herein enable good flowable dielectric deposition with improved nucleation.

Process Overview

FIG. 1 is a process flow diagram illustrating one example of a process for forming a flowable dielectric film involving a pre-treatment operation. The process can be used in the fabrication of semiconductor devices, displays, LEDs, photovoltaic panels and the like. As noted above, in semiconductor device fabrication, the process can be used for BEOL applications and FEOL applications. In some embodiments, the process can include applications in which high aspect ratio gaps are filled with insulating material. Examples include shallow trench isolation (STI) and formation of inter-metal dielectric (IMD) layers, inter-layer dielectric (ILD) layers, pre-metal dielectric (PMD) layers, passivation layers, and filling gaps at the interconnect level. Further examples include formation of sacrificial layers for air gap formation or lift-off layers.

First, a substrate is provided to a treatment chamber (block 101). Examples of substrates include semiconductor substrates, such as silicon, silicon-on-insulator (SOI), gallium arsenide and the like, as well as glass and plastic substrates. In many embodiments, the substrate includes one or more gaps, which may be trenches, holes, vias, etc. FIGS.

Figure 2A:
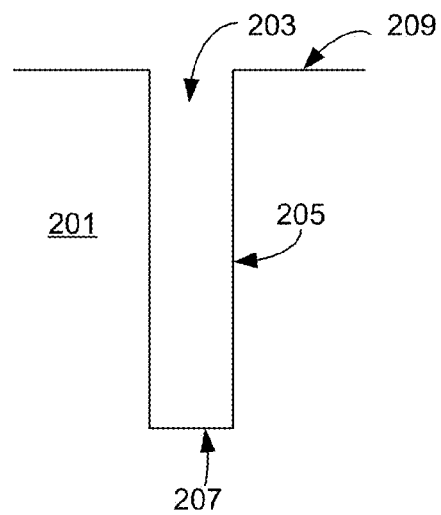
FIGS. 2A-2C show examples of schematic cross-sectional illustrations of substrates including gaps and that may be treated prior to filling the gap with a flowable dielectric film.
Figure 2B:
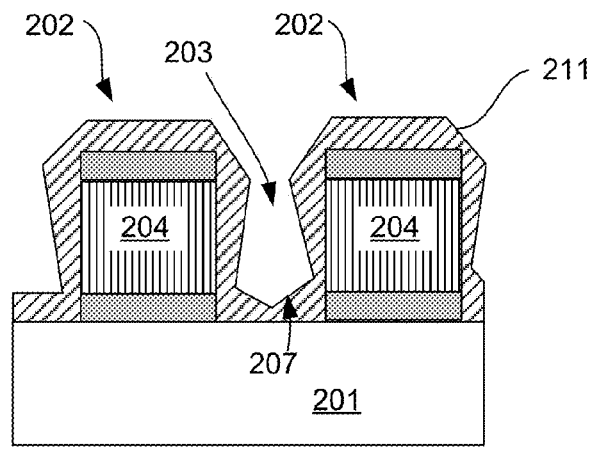

2A-2C show examples of schematic cross-sectional illustrations of substrates 201 including gaps 203. Turning first to FIG. 2A, a gap 203 can be defined by sidewalls 205 and a bottom 207. It may be formed by various techniques, depending on the particular integration process, including patterning and etching blanket (planar) layers on a substrate or by building structures having gaps there-between on a substrate. In certain embodiments a top of the gap 203 can be defined as the level of planar surface 209. Specific examples of gaps are provided in FIGS. 2B and 2C. In FIG. 2B, a gap 203 is shown between two gate structures 202 on a substrate 201. The substrate 201 may be a semiconductor substrate and may contain n-doped and p-doped regions (not shown). The gate structures 202 include gates 204 and silicon nitride or silicon oxy-nitride layer 211. In certain embodiments, the gap 203 is re-entrant, i.e., the sidewalls taper inwardly as they extend up from the bottom 207 of the gap; gap 203 in FIG. 2B is an example of a re-entrant gap.

Figure 2C:
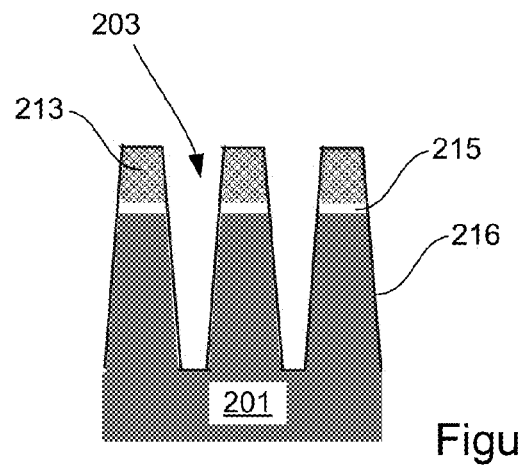

FIG. 2C shows another example of gap to be filled. In this example, gap 203 is a trench formed in silicon substrate 201. The sidewalls and bottom of the gap are defined by liner layer 216, e.g., a silicon nitride or silicon oxynitride layer. The structure also includes pad silicon oxide layer 215 and pad silicon nitride layer 213. FIG. 2C is an example of a gap that may be filled during a STI process. In certain cases, liner layer 216 is not present. In certain embodiments, the sidewalls of silicon substrate 201 are oxidized.

FIGS. 2B and 2C provide examples of gaps that may be filled with dielectric material in a semiconductor fabrication process. The processes described herein may be used to fill any gap that requires dielectric fill. In certain embodiments, the gap critical dimension is the order of about 1-50 nm, in some cases between about 2-30 nm or 4-20 nm, e.g. 13 nm. Critical dimension refers to the width of the gap opening at its narrowest point. In certain embodiments, the aspect ratio of the gap is between 3:1 and 60:1. According to various embodiments, the critical dimension of the gap is 32 nm or below and/or the aspect ratio is at least about 6:1.

As indicated above, a gap typically is defined by a bottom surface and sidewalls. The term sidewall or sidewalls may be used interchangeably to refer to the sidewall or sidewalls of a gap of any shape, including a round hole, a long narrow trench, etc. Also as noted above, the processes described herein may be used to form flowable films on planar surfaces in addition to or instead of in gaps.

Returning to FIG. 1, a deposition surface is treated (block 103). Treatment operations are described further below; in certain embodiments, they involve exposing one or more deposition surfaces to a remotely-generated plasma. As discussed further below, certain treatment operations described herein improve nucleation uniformity and reduce or eliminate nucleation defects.

According to various embodiments, all deposition surfaces of a substrate are exposed to a treatment. In certain embodiments, substrate surfaces may be preferentially exposed. The deposition surface may be one or multiple materials. For example, for gapfill, the sidewall and bottom surfaces that define the gap may be one materials or include multiple materials that can be exposed to the treatment. Referring to FIG. 2C, for example, if a liner layer 216 is present, it may be the only deposition surface. However, if the liner layer 216 is not present, the deposition surface can include the silicon substrate 201, the pad silicon oxide layer 215 and the pad silicon nitride layer 213. Examples of gap sidewall and/or bottom materials include silicon nitrides, silicon oxides, silicon carbides, silicon oxynitrides, silicon oxycarbides, silicides, silicon germanium, as well as bare silicon or other semiconductor material. Particular examples include SiN, $SiO_2$, SiC, SiON, NiSi, and polysilicon. Further examples of gap sidewall and/or bottom materials used in BEOL processing include copper, tantalum, tantalum nitride, titanium, titanium nitride, ruthenium and cobalt. In certain embodiments, prior to flowable dielectric deposition, the gap is provided with a liner, barrier or other type of conformal layer formed in the gap, such that the deposition surfaces treated in block 103 include the conformal layer.

Returning to FIG. 1, according to various embodiments, the treatment in block 103 may be performed in the same or different chamber as the subsequent deposition. In the latter case, the substrate is transferred after block 103 to a deposition chamber. It should be noted that in some embodiments, the treatment described herein may be employed with or without an air break. As discussed further below, embodiments described herein have been shown to be effective even after being exposed to an ambient environment with a long queue time. Thus, the treatment and subsequent deposition may be performed in the same chamber or cluster tool under vacuum, there is no requirement to do so. This feature provides process flexibility.

A flowable dielectric film is then deposited on the treated surfaces (block 105). In many embodiments, this involves exposing the substrate to gaseous reactants including a dielectric precursor and a co-reactant such that a condensed flowable film forms in the gap. According to various embodiments, various reaction mechanisms may take place including on or more of the reaction(s) occurring in the gap and reaction(s) occurring of on field regions with at least some of film flowing into the gap. Examples of deposition chemistries and reaction mechanisms according to various embodiments are described below; however, the methods are not limited to a particular chemistry or mechanism. If depositing an silicon oxide, the dielectric precursor can a silicon-containing compound and the co-reactant an oxidizing compound such as a peroxide, ozone, oxygen, steam, etc. As described further below, the deposition chemistry may include one or more of a solvent and a catalyst as well.

Examples of silicon precursors are given below. The surface treatments described herein may be particularly useful for precursors that are more hydrophobic. For example, in some embodiments, the silicon-containing precursor includes one or more Si—C bonds.

The process gases may be introduced into the reactor simultaneously, or one or more component gases may be introduced prior to the others. The reaction may be a non-plasma (chemical) reaction or be a plasma-assisted reaction. U.S. patent application Ser. No. 12/334,726, incorporated by reference above, describes depositing flowable dielectric films by plasma-enhanced chemical vapor deposition (PECVD) processes.

In cases in which the substrate includes at least one gap to be filled, the deposition operation may proceed until the gap is only partially filled, or at least until the gap is wholly filled, with flowable dielectric material. In certain embodiments, a gap is filled via a single cycle, with a cycle including a pre-treatment operation and a deposition operation, and if performed, a post-deposition treatment operation. In other embodiments, a multi-cycle reaction is performed, and operation 105 only partially fills the gap.

After the deposition operation, an optional post-deposition treatment operation may be performed (block 107). The post-deposition treatment operation may include one or more operations to densify the as-deposited film and/or chemically convert the as-deposited film to the desired dielectric material. For example, the post-deposition treatment may involve an oxidizing plasma that converts the film to an Si—O network and densifies the film. In other embodiments, different operations may be performed for conversion and densification. Densification treatments may also be referred to as cures or anneals. The post-deposition treatment may be perform in situ, i.e., in the deposition module, or ex-situ in another module, or in a combination of both. Further description of post-deposition treatment operations is provided below. According to various embodiments, a post-treatment operation may affect all of, or only a top portion of the deposited film. For example, in certain embodiments, exposure to an oxidizing plasma oxidizes the entire depth of the deposited film but densifies only a top portion. In other embodiments, the entire thickness deposited in the preceding operation is densified.

Figure 3:
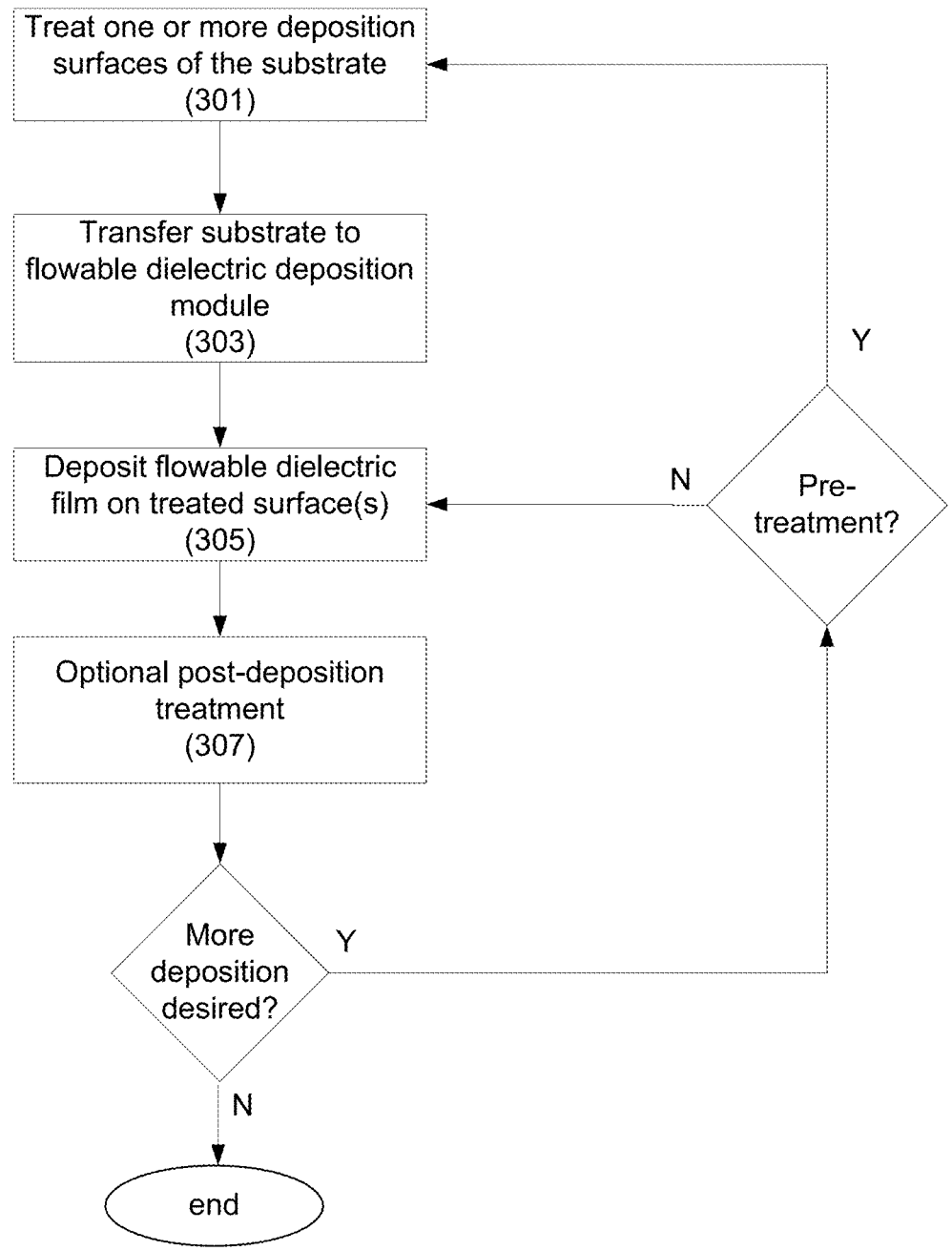
FIG. 3 is a flow diagram illustrating an example of a multi-cycle process for forming a flowable dielectric film involving a pre-treatment operation.

FIG. 3 is a flow diagram illustrating an example of a multi-cycle process in which a substrate is pre-treated in a separate module prior to flowable dielectric deposition. The process begins with treating one or more deposition surfaces (block 301). The substrate is then transferred to a flowable dielectric deposition module (block 303). In some embodiments, the transfer may be under vacuum or inert atmosphere. Examples of inert atmospheres include helium (He), argon (Ar), and nitrogen ($N_2$). In other embodiments (not depicted), the pre-treatment can be performed in situ in the deposition module and the transfer operation is not required. Once in the deposition module, a flowable dielectric film is deposited to partially fill one or more gaps on the substrate (block 305). An optional post-deposition treatment can be performed (block 307). If the desired thickness is deposited and no post-deposition treatment is desired, the process ends. If an ex-situ cure is to be performed the wafer is transferred to a cure module (not depicted). The cure module may be the same or a different module as used in operation 301. Further, the process conditions (e.g., treatment type, process gas composition, relative flow rates, power, etc.) may be the same or different than in operation 301. If more deposition is desired, the process may returns to operation 301 or 305, depending on whether the deposition surfaces are to be treated. Note that the deposition surfaces may now include material deposited and possibly treated in the previous cycle. And, if the substrate has been transferred from the deposition module for a post-deposition operation, the process may return to operation 303.

FIGS. 1 and 3 above provide examples of process flows in accordance with various embodiments. One of ordinary skill in the art will understand that the flowable dielectric deposition methods described herein may be used with other process flows, and that specific sequences as well as the presence or absence of various operations will vary according to implementation.

In some embodiments, pre-deposition treatment operations disclosed herein may be performed on porous dielectrics. In some such embodiments, operation 105 in FIG. 1 may be a pore sealing operation to seal pores in the porous dielectric. For example, as described in U.S. patent application Ser. No. 14/464,071, which is incorporated by reference herein in its entirety, deposition of a flowable film on an etched ultra-low k (ULK) film may be used to seal pores in the ULK film prior to metallization. In the processes in that application, a flowable dielectric film may be deposited by capillary condensation in the pores. The methods disclosed herein may also be used to pre-treat porous dielectric surfaces prior to pore sealing or other operations that are performed by spin-on glass deposition techniques.

Surface Treatment

According to various embodiments, pre-deposition treatment operations that improve nucleation are provided. As described above, the pre-deposition treatment operation may take place before any dielectric deposition has taken place. In multi-cycle operations, the pre-treatment may or may not be performed prior to subsequent deposition operations.

Figure 4:
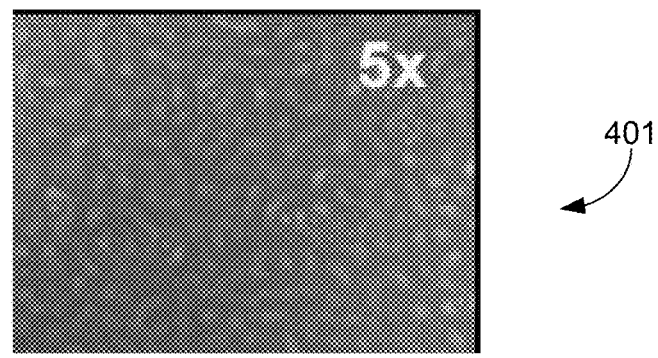
FIG. 4 shows optical microscope images of blanket flowable oxide films deposited on substrate surfaces with and without a surface treatment prior to deposition.
Figure 4:
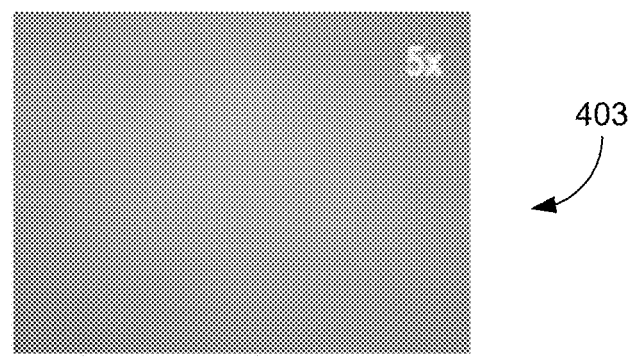

Embodiments of the methods described herein provide hydrophilic surfaces that can be wet and nucleate evenly during deposition. A hydrophilic surface may be characterized as having a wetting contact angle of about 15° or less. The methods described herein provide a uniform surface such that the growth rate is uniform across the surface. Without such a surface, the deposited film may include nucleation defects, which can include poor thickness uniformity, voiding, and surface defects. FIG. 4 shows optical microscope images of blanket flowable oxide films deposited on a substrate. Image 401 is a 5×-magnified image of a 2 kÅ film deposited on oxide with no pre-treatment and image 403 shows is a 5×-magnified image of a 2 kÅ film deposited on oxide with pre-treatment to create a hydrophilic surface. Nucleation defects, such as peaks and valleys in the film, are apparent in image 401. The peaks and valleys indicate non-uniform film thickness due to poor wetting and island growth. Image 403 shows a uniform and even film, with no defects, due to good wetting and laminar growth.

It has been found that certain surface treatments, while effective in creating a hydrophilic surface, create a high wet etch rate (WER) interface layer between the substrate and the dielectric film. Such a layer can lead to problems in downstream integration. For example, direct hydrogen ($H_2$) plasma treatment of substrate surface has been found to result in a high WER oxide-like interface layer. The surface treatment methods described herein create a hydrophilic surface to allow better wetting of subsequent deposition operations, without creating a thick high WER interface layer. In some implementations, the treatment results in a hydroxyl group (—OH) terminated surface, for example, with silicon-containing surfaces, the treatment may result in silanol (Si—OH) terminated surfaces. If formed, an interface layer is very thin, e.g., about 20 Å or less.

Without being bound by a particular theory, it is believed that plasma treatments employing a direct plasma in the deposition chamber may oxidize the substrate surface due to residual water in the deposition chamber that may be present from previous depositions, leading to the formation of an oxide-like interface layer even in the presence of a plasma formed from a reducing process gas such as hydrogen gas. Oxidation damage to the substrate surface may also occur. Accordingly, in embodiments in which the surface treatment is a plasma treatment, a remotely-generated plasma is employed.

Figures 5, 6:
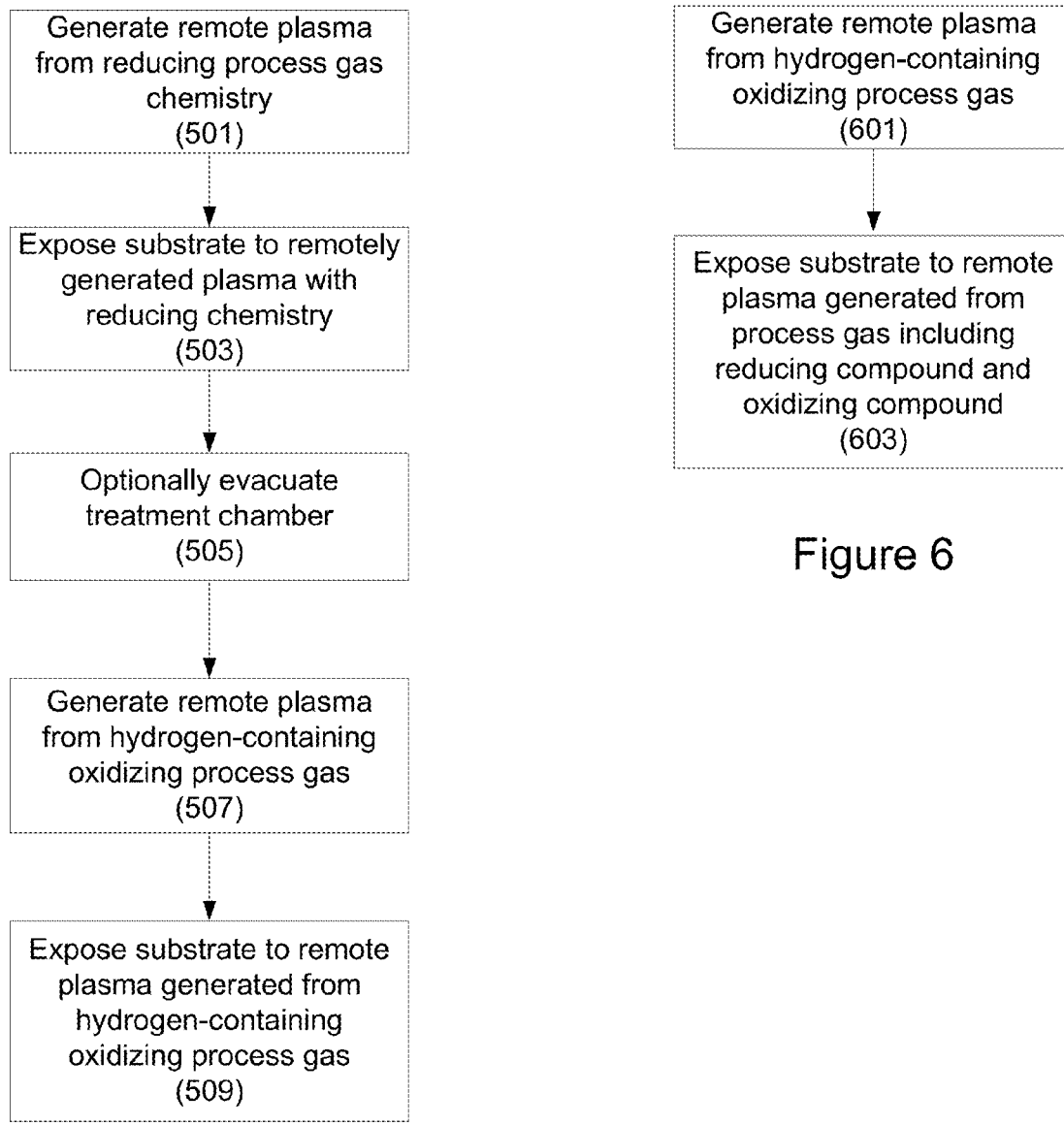
FIG. 5 is a flow diagram illustrating an example of substrate surface treatment process including multiple plasma exposure operations.
FIG. 6 is a flow diagram illustrating an example of substrate surface treatment process including exposure to a single plasma chemistry.

In some implementations, the treatment involves multiple plasma exposure operations with different chemistries. FIG. 5 is a flow diagram illustrating an example of substrate surface treatment process including multiple plasma exposure operations. First, a remote plasma is generated from a process gas having a reducing chemistry (block 501). In some embodiments, the process gas has a H-containing reducing chemistry. Examples include remote plasmas generated from hydrogen ($H_2$), $H_2$ mixed with nitrogen ($N_2$), ammonia ($NH_3$), hydrazine ($N_2H_2$), and combinations thereof. In some embodiments, an inert carrier gas such as argon (Ar) or helium (He) may be included in the gas from which the plasma is generated. The plasma generator is remote from the treatment chamber such that the substrate is not exposed to the generated plasma directly, but to activated species fed into the treatment chamber from the plasma generator. In some embodiments, the activated species are chiefly non-ionic radical species with most or substantially all of the ions recombined prior to reaching a substrate exposure area. In some embodiments, a treatment chamber may include a showerhead through which the remotely generated plasma enters the chamber; a showerhead may facilitate ionic recombination. The remote plasma may be generated from a process gas that has no oxygen-containing component. (One having ordinary skill in the art will understand that there may be trace amounts of oxygen-containing components present).

The substrate is then exposed to the remote plasma (block 503). In some embodiments, the main reactive species to which the substrate is exposed are H radicals. Including $N_2$ in a process gas with $H_2$ can help with H radical formation in some embodiments. While the substrate may be exposed to N radicals and/or other species, H radicals are the main reactive species.

After exposure, the treatment chamber may be optionally evacuated, for example to avoid mixing of chemicals used in each operation such as $H_2$ and oxygen ($O_2$) and plasma species thereof (block 505).

Then, a remote plasma is generated from an hydrogen-containing oxidizing process gas (block 507). Examples include remote plasmas generated from water ($H_2O$), hydrogen peroxide ($H_2O_2$), alcohols, mixtures of one or more of $H_2$, $H_2/N_2$, $NH_3$, $N_2H_2$ with one or more of $O_2$, ozone ($O_3$), $H_2O$, $H_2O_2$, $CO_2$, CO, etc. Examples of process gases include $H_2O$, $H_2O_2$, $H_2/O_3$, $H_2/O_2$, $H_2O/O_2$, $NH_3/O_2$, $NH_3/H_2O$, $H_2/N_2/O_2$, $H_2/CO_2$, $H_2/CO$, $H_2/N_2/CO2$, $H_2/N_2/CO$ and $H_2/N_2/O_3$. In addition to the hydrogen-containing and oxidizing compound(s), a process gas introduced to a remote plasma generator may include one or more gases that facilitate plasma generation. For example, if $H_2O$ is used, it may be carried by $O_2$, or another gas such Ar or He. In a particular example, a 10:1 volumetric ratio of $O_2:H_2O$ may be employed. The substrate is then exposed to the hydrogen-containing remote plasma having an oxidizing chemistry (block 507). As described above with respect to block 503, the substrate may be exposed primarily to radical plasma species with relatively few or substantially no ionic species present.

In some embodiments, the treatment may involve exposure to a single plasma chemistry. FIG. 6 shows a process flow of an example of such a treatment. First, a remote plasma is generated from a process gas including one or more reducing compounds (e.g., $H_2$, $NH_3$, and $N_2H_2$) and one or more oxidizing compounds (e.g., $O_2$, $O_3$, $H_2O$, $H_2O_2$, $CO_2$, and CO). Examples of process gases include $H_2/O_3$, $H_2/O_2$, $H_2/H_2O/O_2$, $NH_3/O_2$, $NH_3/H_2$, $NH_3/H_2O/O_2$, $H_2/H_2/O_2$, $H_2/CO_2$, $H_2/CO$, $H_2/H_2/CO2$, $H_2/N_2/CO$ and $H_2/N_2/O_3$. Next, the substrate is exposed to the remote plasma (block 603). As described above with respect to FIG. 5, the substrate may be exposed primarily to radical plasma species with relatively few or substantially no ionic species present. In some embodiments, the substrate may be exposed H radicals, oxygen (O) radicals, and/or hydroxyl (OH) radicals. In some embodiments, the oxidizing compound has an oxidation potential greater than that of $H_2O$.

The following reaction mechanism may be employed in blocks 503/507 or 603 in some embodiments to chemically modify a Si—X surface, where X may be oxygen (O), carbon (C), nitrogen (N), etc.:

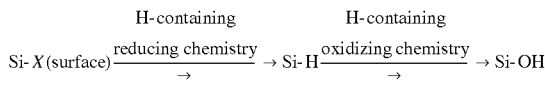

In the above mechanism, the H-containing reducing chemistry reduces surface contaminants, removes carbonaceous material, and creates Si—H bonding. The H-containing oxidizing chemistry oxidizes surface bonds to form Si—OH bonding without oxidizing to Si—O terminated surfaces. In some embodiments, the oxidation of the silicon-containing material on the substrate is less than 20 Å, minimizing the formation of a high WER interface layer.

It has been found that, at least at relatively low temperatures, exposure to a remote plasma generated from the following processes gases do not adequately prepare the surface for good nucleation: $H_2$ (single stage), $H_2O$ (single stage), and $H_2$ followed by $O_2$ (two stage). In the latter case, it is believed without being bound by a particular theory that a non-H containing oxidizing environment may lead to Si—O terminated surfaces. It is further theorized that single stage $H_2$ does not work as there is no oxidant present and single stage $H_2O$ is not a strong enough oxidant.

In some embodiments, the surface treatment chemistry can be tailored to the underlying substrate such that —OH or other hydrophilic bonds that facilitate deposition are formed while minimizing degradation of the substrate surface. The process gas from which the plasma is generated in any of operations 501 and/or 505 or 603 may vary according to the composition of the deposition surface. For example, in embodiments in which flowable dielectric is to be deposited on a SiN surface, the process gas may include an N-containing compound to minimize nitrogen depletion. Similarly, if the surface includes carbon, the process gas may include a carbon containing compound. This can be particularly important if the surface to be treated is a surface of a very thin layer, such as a liner.

Example surface treatment process conditions are given below:
Treatment chamber pressure: 30 mTorr-10 Torr
Remote plasma generator power: 25 W-5000 W
Substrate-showerhead spacing: 8 mm-45 mm
Treatment time: 1 s-240 s
Temperature: −20° C.-300° C.

A relatively low temperature (equal to or under 150° C.) may allow the treatment to be performed at a temperature at which a flowable dielectric film can be deposited.

The treatments described above with reference to FIGS. 5 and 6 can be used to provide equivalent deposition surfaces regardless of the composition of the substrate. Table 1, below, shows contact angles for bare Si (native oxide), SiN and thermal $SiO_2$, without and with surface treatment.

TABLE 1

Contact angles on treated and untreated bare Si, SiN, and thermal oxide substrates

| | bare Si (thermal oxide) | SiN | thermal $SiO_2$ |
|---|---|---|---|
| Literature value | 5° | 27.5° | 45° |
| Measured contact angle - no surface treatment | 5° | 26° | 45° |
| Measured contact angle - 2 stage ($H_2/N_2 + H_2O/O_2$) remote plasma surface treatment | 5° | <16° | <16° |

Figure 7:
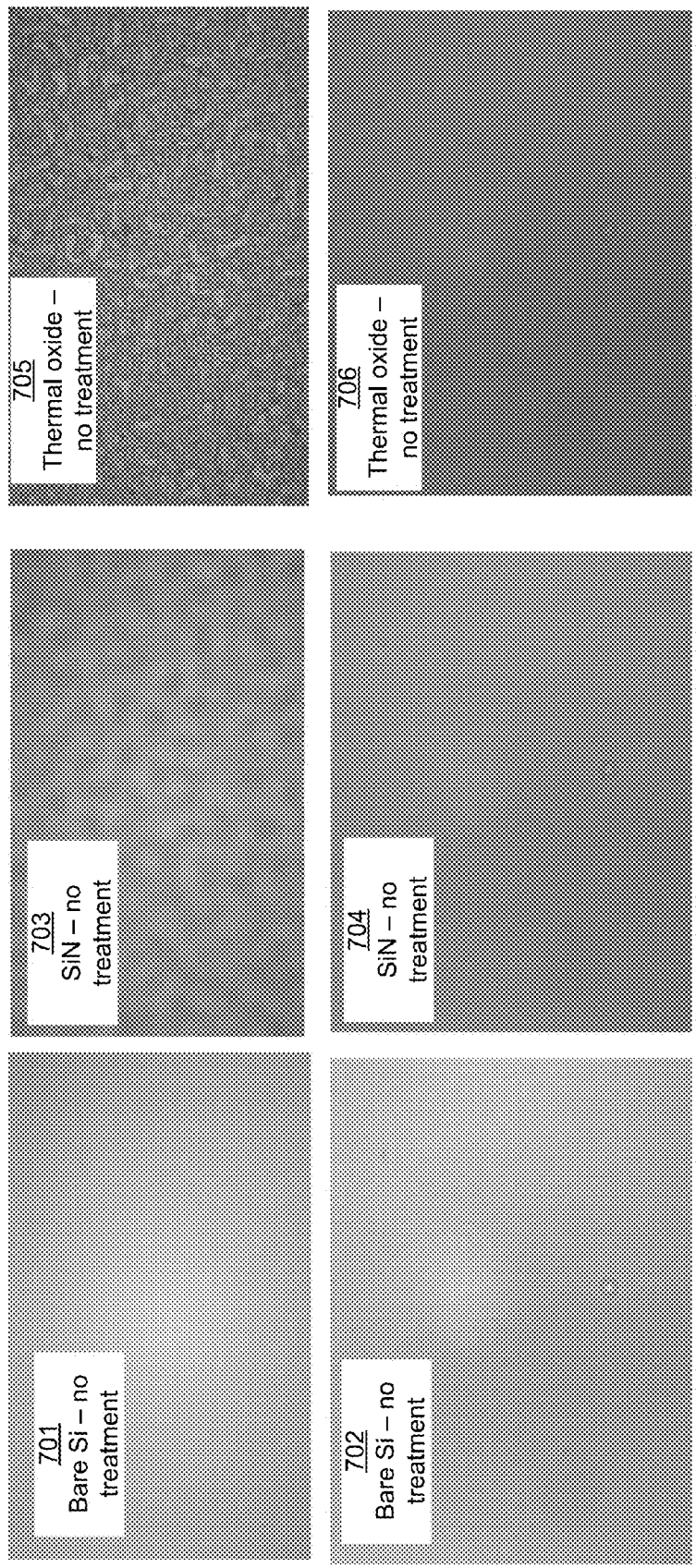
FIG. 7 shows optical microscope images of blanket flowable oxide films deposited on bare silicon (Si), silicon nitride (SiN), and thermal silicon oxide (thermal $SiO_2$) with and without surface treatments prior to deposition.

Images (5× magnification) of 2 kÅ flowable oxide films deposited on the surfaces are provided in FIG. 7. Images 701 and 702 show uniform film thickness of flowable oxide films deposited on untreated and treated bare silicon substrates, respectively. As shown in Table 1, bare Si substrates are hydrophilic even prior to treatment. The surface treatment renders hydrophobic SiN surfaces hydrophilic. Image 703 shows peaks and valleys associated with non-uniform film thickness on an untreated SiN substrate. Flowable oxide film deposited on a treated SiN is uniform, as shown in image 704. The surface treatment also renders hydrophobic thermal oxide surfaces hydrophilic. Thermal oxide substrates provide the worst surface for nucleation without treatment (image 705). However, the flowable oxide deposited after treating the thermal oxide (image 706) shows no nucleation defects. While flowable dielectric wetting can be more difficult on hydrophobic surfaces, the surface treatment can provide equivalent hydrophilic termination, such that nucleation and wetting on a thermal oxide film, for example, is as good as on a bare silicon substrate or a treated SiN substrate.

Figure 8:
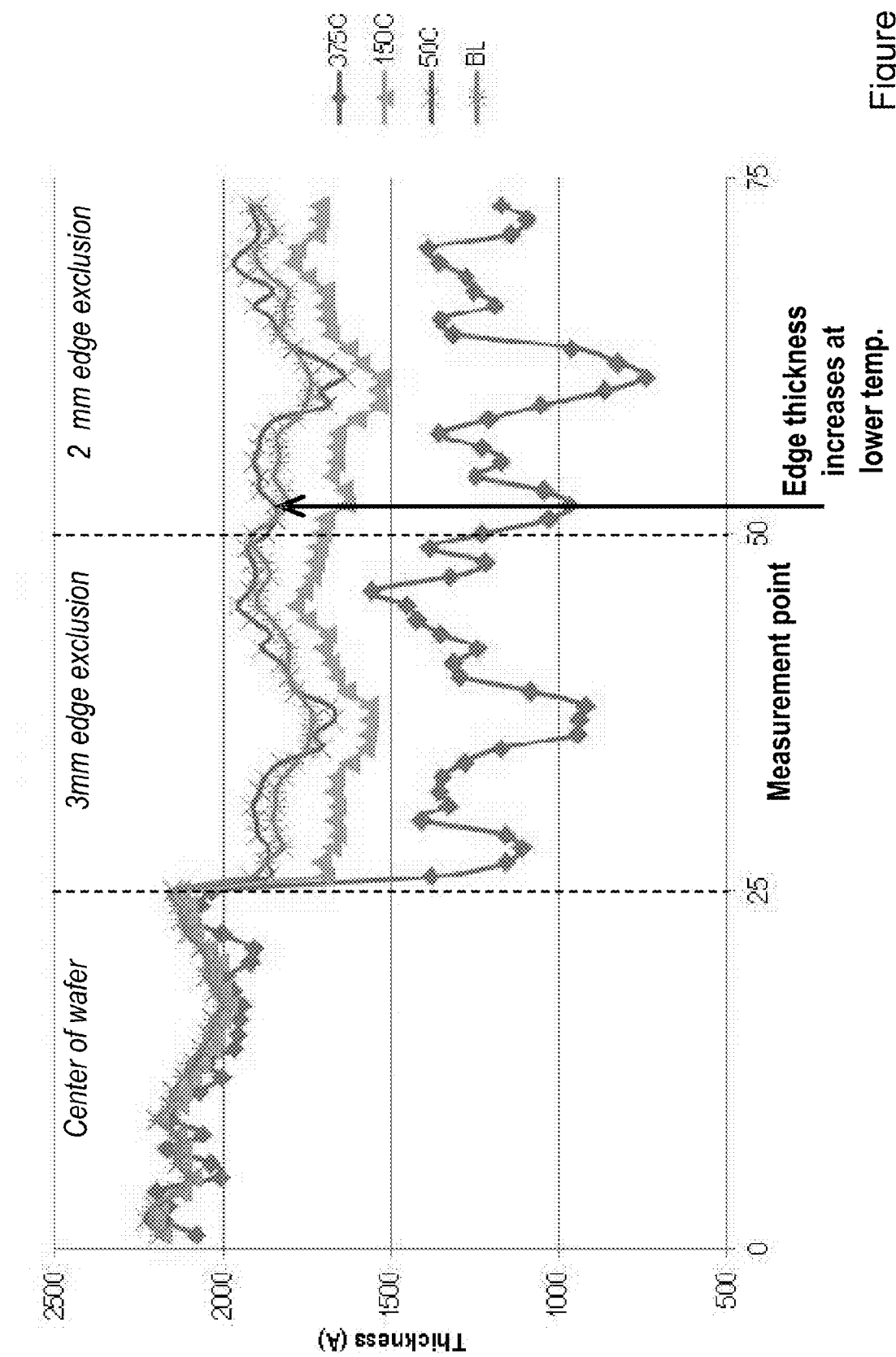
FIG. 8 is a graph showing the effect of pre-deposition surface treatment temperature on deposited film uniformity.

As noted above, in some embodiments, the treatment can be performed at relatively low temperatures. In addition to allowing, the treatment to be performed at or near the deposition temperature for low temperature deposition processes, film uniformity may improve with decreased temperature. FIG. 8 is a graph showing deposited flowable oxide thickness measured at various points on substrates treated at 50° C., 150° C., and 375° C. The graph demonstrates that thickness uniformity is improved at lower temperatures. Accordingly, in some embodiments, the treatment is performed at temperatures lower than about 150° C., or lower than about 100° C., or lower than about 50° C.

Figure 9:
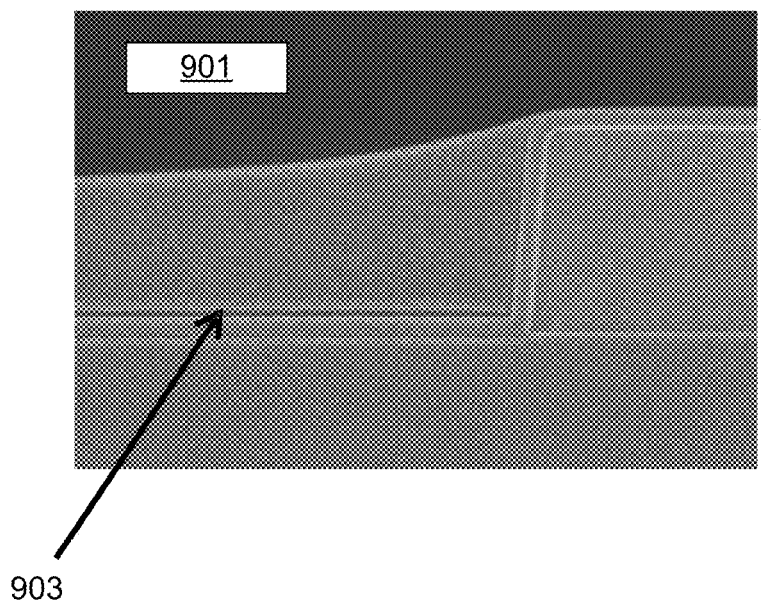
FIG. 9 shows scanning electron microscope (SEM) images of flowable oxide films deposited in gaps having SiN liners after direct and remote plasma surface treatments.
Figure 9:
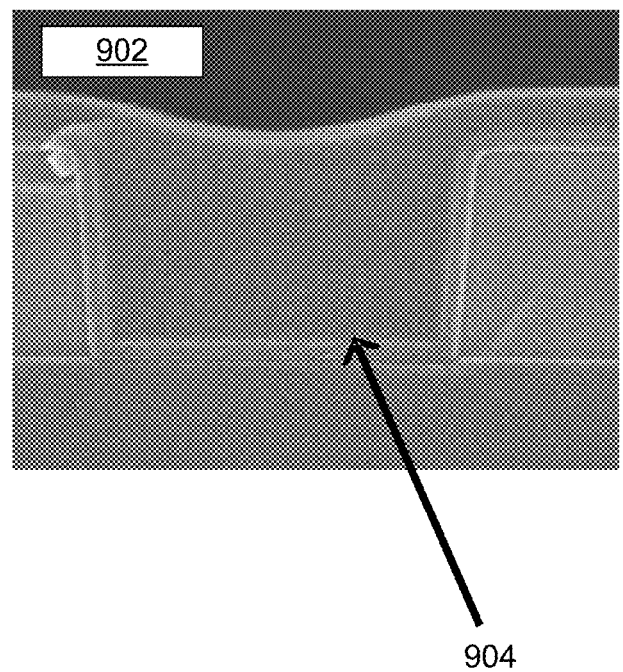

FIG. 9 shows a comparison of remote plasma surface treatment as described herein with an in-situ plasma surface treatment. As noted above, a direct $H_2$ plasma treatment may provide a good surface for nucleation, but it has been found that it can also create an undesirably thick oxide interface layer. FIG. 9 shows SEM images 901 and 902 of flowable oxide films deposited on a SiN liner after a direct plasma treatment (image 901) and after a remote plasma treatment (image 902). The direct plasma treatment involved exposure to a direct $H_2$ plasma in a flowable oxide deposition chamber. A high WER interface layer in image 901 is indicated at 903. It is believed that this an undoped oxide layer (not SiCOH), which has a high WER. As discussed above, this can present problems during integration. Image 902 shows no visible interface layer, with the flowable oxide fill shown directly contacting the SiN liner at 904. The remote plasma surface treatment was a two stage $H_2/N_2+H_2O/O_2$ remote plasma treatment.

A comparison of direct and remote plasma treatments was also performed on gaps including a $SiO_2$ liner surface. Oxide surfaces provide a more aggressive test of pre-deposition surface treatment than the SiN surfaces shown in FIG. 9. A direct $H_2$ plasma treatment was found to cause sidewall porosity in the deposited flowable oxide fill. Flowable oxide deposition after a remote plasma treatment ($H_2/N_2+H_2O/O_2$) showed no sidewall porosity.

The effect of queue time between pre-treatment and deposition was determined by performing a pre-deposition treatment on substrates with thermal oxide surfaces, then allowing the treated substrate to wait in air or $N_2$ atmosphere prior to flowable oxide deposition. Results of deposition, as determined by optical microscopy are shown in Table 2, below.

TABLE 2

Effect of post-treatment queue time on deposition quality

| Queue time/atmosphere | Deposition quality (2 kÅ flowable oxide on thermal oxide) |
|---|---|
| 2 hours/air | Good wetting performance, no defects |
| 17 hours/air | Good wetting performance, no defects |
| 3 days/air | Good wetting performance, no defects |
| 7 days/air | Good wetting performance, no defects |
| 7 days/$N_2$ | Good wetting performance, no defects |

The results in Table 2 indicate that the treatment may be performed with an air break prior to flowable dielectric deposition.

In some embodiments, a surface treatment may involve exposure to species in the presence of ultraviolet (UV) radiation in addition to or instead of a remotely generated plasma. Also, in some embodiments, reactive species may be activated by exposure to UV radiation.

While the description below refers chiefly to surface treatments for the deposition of flowable dielectric films from vapor phase reactants, the treatments are not so limited and may be used with any process where hydrophilicity and/or adhesion is critical. Examples include spin-on materials, wet chemical cleaning or etching, electroplating, traditional thermal CVD, and sub-atmospheric CVD. Further, the treatments may be used as an alternative to traditional wet chemistries to create a hydrophilic surface, including in very narrow and/or high aspect ratio features and for semiconductor and microelectromechanical processes that cannot tolerate the capillary forces as they lead to structural damage.

Deposition Chemistries and Post-Deposition Treatments

For forming silicon oxides, the process gas reactants generally include a silicon-containing compound and an oxidant, and may also include a catalyst, a solvent (and/or other surfactant) and other additives. The gases may also include one or more dopant precursors, e.g., a carbon-, nitrogen-, fluorine-, phosphorous- and/or boron-containing gas. Sometimes, though not necessarily, an inert carrier gas is present. In certain embodiments, the gases are introduced using a liquid injection system. In certain embodiments, the silicon-containing compound and the oxidant are introduced via separate inlets or are combined just prior to introduction into the reactor in a mixing bowl and/or showerhead. The catalyst and/or optional dopant may be incorporated into one of the reactants, pre-mixed with one of the reactants or introduced as a separate reactant. The substrate can be then exposed to the process gases, for example, at block 105 of FIG. 1 or at block 305 of FIG. 3. In some embodiments, conditions in the reactor are such that the silicon-containing compound and the oxidant react to form a condensed flowable film on the substrate. Formation of the film may be aided by presence of a catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. The substrate is exposed to the process gases for a period sufficient to deposit the desired amount of flowable film. For gapfill, the deposition may proceed long enough to fill at least some of the gap or overfill the gap as desired.

In certain embodiments, the silicon-containing precursor is an alkoxysilane. Alkoxysilanes that may be used include, but are not limited to, the following:

$H_x$—Si—$(OR)_y$, where x=0-3, x+y=4 and R is a substituted or unsubstituted alkyl group;

$R'_x$—Si—$(OR)_y$, where x=0-3, x+y=4, R is a substituted or unsubstituted alkyl group and R' is a substituted or unsubstituted alkyl, alkoxy or alkoxyalkane group; and $H_x(RO)_y$—Si—Si—$(OR)_y H_x$ where x=0-2, x+y=3 and R is a substituted or unsubstituted alkyl group.

Examples of silicon containing precursors include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), tetraisocyanatesilane (TICS), bis-tert-butylamino silane (BTBAS), hydrogen silsesquioxane, tert-butoxydisilane, T8-hydridospherosiloxane, OctaHydro POSS™ (Polyhedral Oligomeric Silsesquioxane) and 1,2-dimethoxy-1,1,2,2-tetramethyldisilane. Further examples of silicon containing precursors include, but are not limited to, silane ($SiH_4$), disilane, trisilane, hexasilane, cyclohexasilane, and alkylsilanes, e.g., methylsilane, and ethylsilane.

In certain embodiments, carbon-doped silicon precursors are used, either in addition to another precursor (e.g., as a dopant) or alone. Carbon-doped precursors can include at least one Si—C bond. Carbon-doped precursors that may be used include, but are not limited to the, following:

$R'_x$—Si—$R_y$, where x=0-3, x+y=4, R is a substituted or unsubstituted alkyl group and R' is a substituted or unsubstituted alkyl, alkoxy or alkoxyalkane group; and $SiH_x R'_y$—$R_z$ where x=1-3, y=0-2, x+y+z=4, R is a substituted or unsubstituted alkyl group and R' is a substituted or unsubstituted alkyl, alkoxy or alkoxyalkane group.

Examples of carbon-doped precursors are given above with further examples including, but not being limited to, trimethylsilane (3MS), tetramethylsilane (4MS), diethoxymethylsilane (DEMS), dimethyldimethoxysilane (DMDMOS), methyl-triethoxysilane (MTES), methyltrimethoxysilane, methyl-diethoxysilane, methyl-dimethoxysilane, trimethoxymethylsilane, (TMOMS), dimethoxymethylsilane, and bis(trimethylsilyl)carbodiimide.

In certain embodiments aminosilane precursors are used. Aminosilane precursors include, but are not limited to, the following:

$H_x$—Si—$(NR)_y$ where x=0-3, x+y=4 and R is an organic of hydride group.

Examples of aminosilane precursors are given above, with further examples including, but not being limited to -tert-butylamino silane (BTBAS) or tris(dimethylamino)silane.

Examples of suitable oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). In certain embodiments, a remote plasma generator may supply activated oxidant species.

One or more dopant precursors, catalysts, inhibitors, buffers, surfactants, solvents and other compounds may be introduced. In certain embodiments, a proton donor catalyst is employed. Examples of proton donor catalysts include 1) acids including nitric, hydrofluoric, phosphoric, sulphuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_x X_y H_z$ where x=1-2, y=1-3, z=1-3 and X is a halide; 4) $R_x Si$—$X_y$ where x=1-3 and y=1-3; R is alkyl, aloxy, aloxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated molecules, including halogenated organic molecules, such as dichlorosilane ($SiCl_2 H_2$), trichlorosilane ($SiCl_3 H$), methylchlorosilane ($SiCH_3 ClH_2$), chlorotriethoxysilane, chlorotrimethoxysilane, chloromethyldiethoxysilane, chloromethyldimethoxysilane, vinyltrichlorosilane, diethoxydichlorosilane, and hexachlorodisiloxane. Acids which may be used may be mineral acids such as hydrochloric acid (HCl), sulphruic acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chlorodiethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCl_2CO_2H$), oxalic acid ($HO_2CCO_2H$), benzoic acid ($C_6H_5CO_2H$), and triethylamine.

According to various embodiments, catalysts and other reactants may be introduced simultaneously or in particular sequences. For example, in some embodiments, an acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Some examples of catalysts are given above. Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane. Methods of rapid delivery that may be employed are described in U.S. Pat. No. 8,278,224, incorporated by reference herein.

Surfactants may be used to relieve surface tension and increase wetting of reactants on the substrate surface. They may also increase the miscibility of the dielectric precursor with the other reactants, especially when condensed in the liquid phase. Examples of surfactants include solvents, alcohols, ethylene glycol and polyethylene glycol. Difference surfactants may be used for carbon-doped silicon precursors because the carbon-containing moiety often makes the precursor more hydrophobic.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

As indicated above, any of the reactants (silicon-containing precursor, oxidant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off.

Reactions conditions can be such that the silicon-containing compound and oxidant undergo a condensation reaction, condensing on the substrate surface to form a flowable film. In certain embodiments, the reaction takes place in dark or non-plasma conditions. In other embodiments, the reaction takes place in the presence of a plasma, generated either remotely or in the deposition chamber. Methods of depositing a flowable film for gap fill via a plasma-enhanced chemical vapor deposition (PECVD) reaction are described in U.S. patent application Ser. No. 12/334,726, incorporated by reference herein.

Chamber pressure may be between about 1 and 200 Torr, in certain embodiments, it is between 10 and 75 Torr. In a particular embodiment, chamber pressure is about 10 Torr.

Partial pressures of the process gas components may be characterized in terms of component vapor pressure and range as follows, with Pp the partial pressure of the reactant and Pvp the vapor pressure of the reactant at the reaction temperature.

Precursor partial pressure ratio (Pp/Pvp)=0.01-1, e.g., 0.01-0.5
Oxidant partial pressure ratio (Pp/Pvp)=0.25-2, e.g., 0.5-1
Solvent partial pressure ratio (Pp/Pvp)=0-1, e.g, 0.1-1

In certain embodiments, the process gas is characterized by having a precursor partial pressure ratio is 0.01 and 0.5, an oxidant partial ratio between 0.5 and 1, and a solvent (if present) partial pressure ratio between 0.1 and 1. In the same or other embodiments, the process gas is characterized by the following:
Oxidant:Precursor partial pressure ratio ($Pp_{oxidant}/Pp_{precursor}$)=0.2-30, e.g., 5-15
Solvent:Oxidant partial pressure ratio ($Pp_{solvent}/Pp_{oxidant}$)=0-30, e.g., 0.1-5

In certain embodiments, the process gas is characterized by an oxidant:precursor partial pressure ratio of between about 5 and 15 and a solvent:oxidant partial pressure ration of between about 0.1 and 5.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may require increased pressure. In one embodiment, the temperature is about 5° C. and the pressure about 10 Torr. Exposure time depends on reaction conditions as well as the desired film thickness. Deposition rates are from about 100 angstroms/min to 1 micrometer/min according to various embodiments. In certain embodiments, deposition time is 0.1-180 seconds, e.g., 1-90 seconds.

The substrate is exposed to the reactants under these conditions for a period long enough to deposit a flowable film. As noted above with respect to FIG. 3, the entire desired thickness of film can be deposited in block 305, if it is a single cycle deposition. In other embodiments that employ multiple deposition operations, only a portion of the desired film thickness is deposited in a particular cycle. According to various embodiments, the substrate can be continuously exposed to the reactants during block 305, or one or more of the reactants may be pulsed or otherwise intermittently introduced. Also as noted above, in certain embodiments, one or more of the reactants including a dielectric precursor, co-reactant, catalyst or solvent, may be introduced prior to introduction of the remaining reactants.

As discussed above, a flowable film may be optionally exposed to a post-deposition treatment (see blocks 107 and 307 of FIGS. 1 and 3). This may be done in situ in the deposition chamber or in another chamber. The post-deposition treatment operation may involve one or more operations, any or all of which may also result in physically densifying and/or chemically converting the as-deposited film. In some embodiments, physical densification involves replacing smaller species with larger species, which may result in volume expansion. For example, a Si—H species may be replaced with a Si—O species. The expanded film will typically still be denser.

In some embodiments, a post-deposition treatment may densify without chemical conversion. In certain embodiments, one conversion operation may be separately performed, or not performed at all. If separately performed, a conversion operation may be performed before or after a densification operation. In one example, a film is converted and partially densified by exposure to a reactive plasma followed by further densification by thermal anneal in an inert environment.

According to various embodiments, the film may be densified by purely thermal anneal, exposure to a downstream or direct plasma, exposure to ultraviolet or microwave radiation or exposure to another energy source. Thermal anneal temperatures may be 300° C. or greater (depending on the allowable thermal budget). The treatment may be performed in an inert environment (Ar, He, etc.) or in a potentially reactive environment. Oxidizing environments (using $O_2$, $N_2O$, $O_3$, $H_2O$, $H_2O_2$, NO, $NO_2$, CO, $CO_2$ etc.) may be used, though in certain situation nitrogen-containing compounds will be avoided to prevent incorporation of nitrogen in the film. In other embodiments, nitridizing environments (using $N_2$, $N_2O$, $NH_3$, NO, $NO_2$ etc.) can be used and can incorporate a certain amount of nitrogen in the film. In some embodiments, a mix of oxidizing and nitridizing environments are used. Carbon-containing chemistries may be used to incorporate some amount of carbon into the deposited film. According to various embodiments, the composition of the densified film depends on the as-deposited film composition and the treatment chemistry. For example, in certain embodiments, an Si(OH)$_x$ as-deposited gel is converted to a SiO network using an oxidizing plasma cure. In other embodiments, a Si(OH)$_x$ as-deposited gel is converted to a SiON network. In other embodiments, an Si(NH)$_x$ as-deposited gel is converted to an SiON network.

In certain embodiments, the film is treated by exposure to a plasma, either remote or direct (inductive or capacitive). This may result in a top-down conversion of the flowable film to a densified solid film. The plasma may be inert or reactive. Helium and argon plasma are examples of inert plasmas; oxygen and steam plasmas are examples of oxidizing plasmas (used for example, to remove carbon as desired). Hydrogen-containing plasmas may also be used. An example of a hydrogen-containing plasma is a plasma generated from a mix of hydrogen gas (H$_2$) and a diluent such as inert gas. Temperatures during plasma exposure are typically about 25° C. or higher. In certain embodiments, an oxygen or oxygen-containing plasma is used to remove carbon. In some embodiments, temperature during plasma exposure can be lower, e.g., −15° C. to 25° C.

Temperatures during post-deposition treatments may range from 0-600° C., with the upper end of the temperature range determined by the thermal budget at the particular processing stage. For example, in certain embodiments, the entire process shown in FIG. 1 or FIG. 3 can be carried out at temperatures less than about 400° C. This temperature regime is compatible with NiSi or NiPtSi contacts. In certain embodiments, the temperatures range from about 200° C.-550° C. Pressures may be from 0.1-10 Torr, with high oxidant pressures used for removing carbon.

Other annealing processes, including rapid thermal processing (RTP) may also be used to solidify and shrink the film. If using an ex situ process, higher temperatures and other sources of energy may be employed. Ex situ treatments include high temperature anneals (700-1000° C.) in an environment such as N$_2$, O$_2$, H$_2$O, Ar and He. In certain embodiments, an ex situ treatment involves exposing the film to ultraviolet radiation, e.g., in an ultraviolet thermal processing (UVTP) process. For example, temperatures of 100° C., or above, e.g., 100° C.-400° C., in conjunction with UV exposure may be used to cure the film. Other flash curing processes, including RTP or laser anneal, may be used for the ex situ treatment as well.

In some embodiments, post-deposition treatments can involve partial densification of the deposited flowable film. One example of an integration process including partial densification of a flowable dielectric film is described in U.S. patent application Ser. No. 13/315,123, which is incorporated by reference herein.

The flowable dielectric deposition may involve various reaction mechanisms depending on the specific implementation. Examples of reaction mechanisms in a method of depositing a flowable oxide film according to certain embodiments are described below. It should be noted that while these reaction steps provide a useful framework for describing various aspects of the invention, the methods described herein are not necessarily limited to a particular reaction mechanism.

In some embodiments, the overall deposition process may be described in context of two steps: hydrolysis and condensation. The first step involves hydrolysis of silicon-containing precursors by the oxidant. For example, alkoxy groups (—OR) of the silicon containing precursor may be replaced with hydroxyl groups (—OH). The —OH groups and the residual alkoxy groups participate in condensation reactions that lead to the release of water and alcohol molecules and the formation of Si—O—Si linkages. In this mechanism, the as-deposited film may not have appreciable carbon content even though the alkoxysilane precursor contains carbon. In certain embodiments, reactant partial pressure is controlled to facilitate bottom up fill. Liquid condensation can occur below saturation pressure in narrow gaps; the reactant partial pressure controls the capillary condensation. In certain embodiments, reactant partial pressure is set slightly below the saturation vapor pressure. In a hydrolyzing medium, the silicon-containing precursor forms a fluid-like film on the wafer surface that preferentially deposits in trenches due to capillary condensation and surface tension forces, resulting in a bottom-up fill process.

It should be noted that the methods described herein are not limited to the particular reactants, products and reaction mechanisms described, but may be used with other reactants and reaction mechanisms that produce flowable dielectric films. It will also be understood that deposition and annealing may involve multiple different concurrent or sequential reaction mechanisms.

An example of reactant condensation, hydrolysis and initiation of a flowable dielectric film on a deposition surface follows. The deposition surface is held at a reduced temperature such as −15° C. to 30° C., e.g., −5° C. The reactants include a silicon-containing dielectric precursor, an oxidant, an optional catalyst and an optional solvent. The dielectric precursor absorbs on the surface. A liquid phase reaction between the precursor and oxidant results in hydrolysis of the precursor, forming a product, e.g., silanols Si(OH)$_x$ that are attached to the deposition surface, initiating the growth of the film. In certain embodiments, the presence of the solvent improves miscibility and surface wettability.

Polymerization of the product to form, for example, Si(OH)$_x$ chains as well as condensation of the product to form, for example, crosslinked Si—O chains can follow. The result of the condensation reaction is an as-deposited dielectric film. At this stage, the organic groups may be substantially eliminated from the film, with alcohol and water released as byproducts, though Si—H groups and hydroxyl groups can remain. In some cases, a minute but detectable amount of carbon groups remains. The overall carbon content may be less than 1% (atomic). In some embodiments, essentially no carbon groups remain, such that Si—C groups are undetectable by FTIR. Continuing the example, the as-deposited film can be annealed in the presence of an activated oxygen species, e.g. oxygen radicals, ions, etc. In certain embodiments, the anneal has two effects: 1) oxidation of the film, to convert SiOH and SiH to SiO; and 2) film densification or shrinkage. The oxygen oxidizes Si—H bonds and facilitates formation of a SiO$_x$ network with substantially no Si—H groups. The substrate temperature may be raised, e.g., to 375° C. to facilitate film shrinkage and oxidization. In other embodiments, the oxidation and shrinkage operations are carried out separately. In some embodiments, oxidation may occur at a first temperature (e.g., 200° C.) with further densification occurring at a higher temperature (e.g., 375° C.).

In some embodiments, densification may be limited by film constraints: for example, film in a gap can be constrained by the sidewalls and the bottom of the gap, with the top of the gap the only free surface. As the critical dimension decreases, less free surface is available, less relaxation is possible and a crust or high density region formed at the free surface is thinner. In some cases film below a high density region does not densify. While the constraints formed by the sidewalls and crust prevent densification, a reactant can diffuse through the crust, forming low density dielectric film. For example, oxygen species can diffuse, oxidizing the SiOH and SiH groups even without substantial densification.

The reaction mechanism described above is but one example of a reaction mechanism that may be used in accordance with the present invention, depending on the particular reactants. For example, in certain embodiments, peroxides are reacted with silicon-containing precursors such as alkylsilanes to form flowable films including carbon-containing silanols. In other embodiments, Si—C or Si—N containing dielectric precursors may be used, either as a main dielectric precursor or a dopant precursor, to introduce carbon or nitrogen in the gel formed by a hydrolysis and condensation reaction as described above. For example, triethoxysilane may be doped with methyl-triethoxysilane ($CH_3Si(OCH_2)_3$) to introduce carbon into the as-deposited film. Still further, in certain embodiments the as-deposited film is a silicon nitride film, including primarily Si—N bonds with N—H bonds.

In certain embodiments, the flowable dielectric film may be a silicon and nitrogen-containing film, such as silicon nitride or silicon oxynitride. It may be deposited by introducing vapor phase reactants to a deposition chamber at conditions such that they react to form a flowable film. The vapor phase reactants may include species created by a plasma. Such a plasma may be generated remotely or in the deposition chamber. The nitrogen incorporated in the film may come from one or more sources, such as a silicon and nitrogen-containing precursor (for example, trisilylamine (TSA) or disilylamine (DSA)), a nitrogen precursor (for example, ammonia ($NH_3$) or hydrazine ($N_2H_4$)), or a nitrogen-containing gas fed into a plasma ($N_2$, $NH_3$, NO, $NO_2$, $N_2O$). After deposition, the flowable dielectric film may be treated to do one of more of the following: chemical conversion of the as-deposited film and densification. The chemical conversion may include removing some or all of the nitrogen component, converting a $Si(ON)_x$ film to a primarily SiO network. It may also include removal of one or more of —H, —OH, —CH and —NH species from the film. Such a film may be densified as described above. In certain embodiments, it may be primarily SiN after treatment; or may be oxidized to form a SiO network or a SiON network. Post-deposition conversion treatments may remove nitrogen and/or amine groups. As described above, post-deposition treatment may include exposure to thermal, chemical, plasma, UV, IR or microwave energy.

Apparatus

The methods of the present invention may be performed on a wide-range of modules. The methods may be implemented on any apparatus equipped for plasma treatment and/or deposition of dielectric film, including HDP-CVD reactors, PECVD reactors, sub-atmospheric CVD reactors, any chamber equipped for CVD reactions, and chambers used for PDL (pulsed deposition layers).

Such an apparatus may take many different forms. Generally, the apparatus will include one or more modules, with each module including a chamber or reactor (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate. Examples of suitable reactors are the Sequel™ reactor, the Vector™, the Speed™ reactor, and the Gamma™ reactor all available from Lam Research of Fremont, Calif.

Figure 10A:
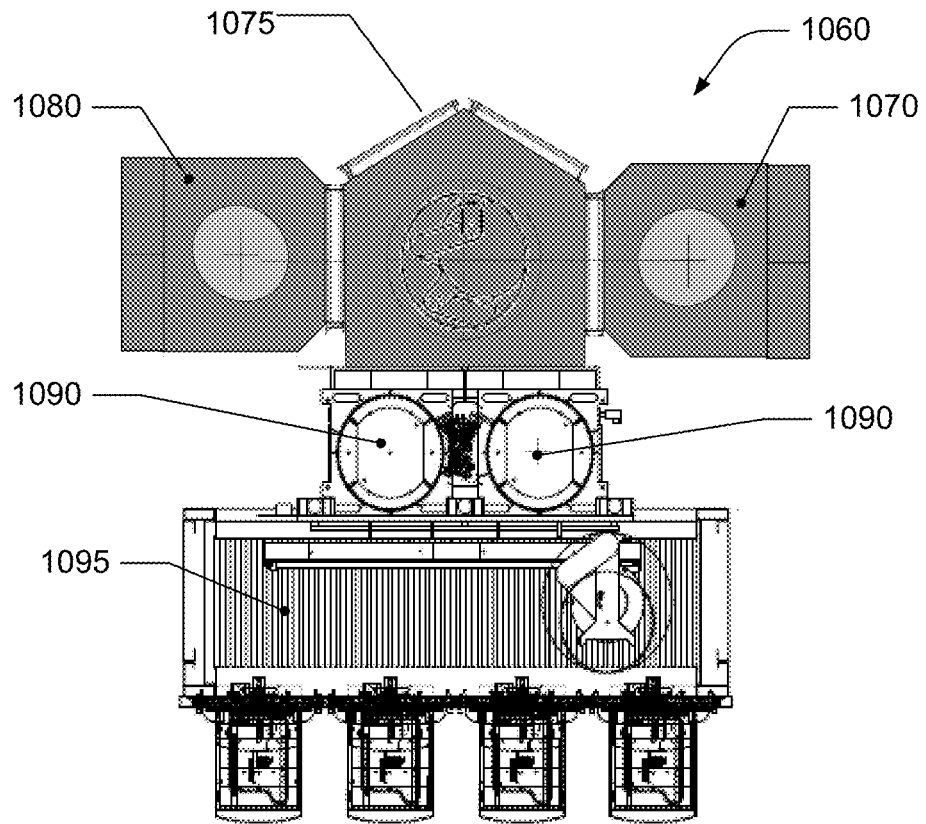
FIGS. 10A, 10B, and 11 are schematic illustrations of apparatus suitable to practice the methods described herein.

As discussed above, according to various embodiments, the surface treatment may take place in the same or different module as the flowable dielectric deposition. Provided herein are semiconductor manufacturing tools including one or more modules for flowable gap fill. FIG. 10A shows an example tool configuration 1060 including wafer transfer system 1095 and loadlocks 1090, remote plasma treatment module 1070, and flowable deposition module 1080. Additional modules, such as a post-deposition cure module, and/or one or more remote plasma treatment modules 1070 or flowable deposition module 1080 may also be included.

Other modules that may be used for pre-treatment or post-treatment include SPEED or SPEED Max, NOVA Reactive Preclean Module (RPM), Altus ExtremeFill (EFx) Module, Vector Extreme Pre-treatment Module (for plasma, ultra-violet or infra-red pre-treatment), SOLA (for UV pre-treatment), and Vector or Vector Extreme modules. These modules may be attached to the same backbone as the flowable deposition module. Also, as described above, the remote plasma treatment module and flowable deposition module may be on different backbones. A system controller may be connected to any or all of the components of a tool; its placement and connectivity may vary based on the particular implementation. An example of a system controller is described below with reference to FIG. 11.

Figure 10B:
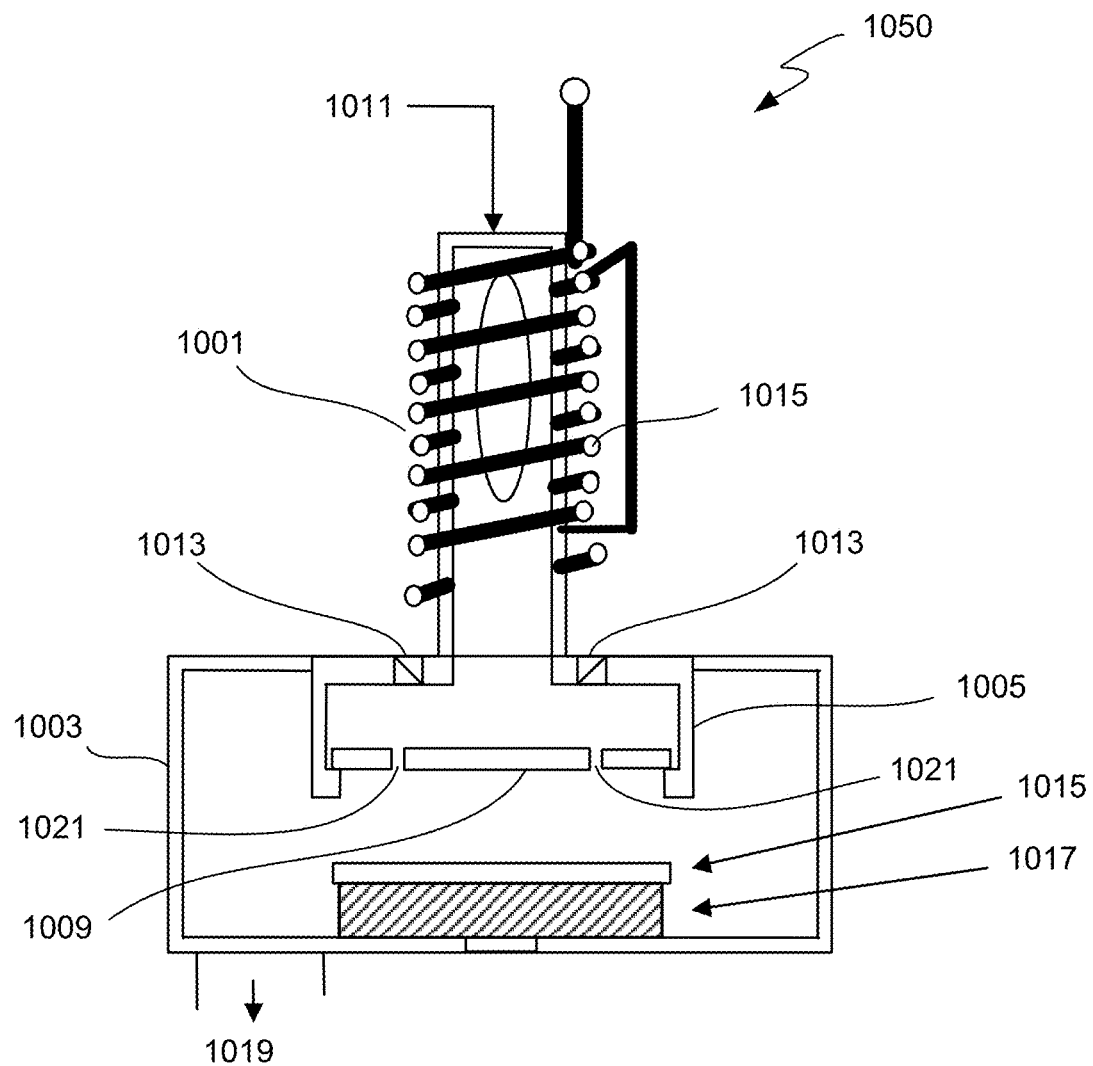

FIG. 10B is a schematic illustration of an apparatus 1050 suitable to practice the surface treatment methods of claimed invention. Apparatus 1050 has a plasma source 1001 and a process chamber 1003 separated by a showerhead assembly 1005. Plasma source 1001 is connected to one or more gas inlets 1011. Showerhead 1009 forms the bottom of showerhead assembly 1005. Inert gas inlets 1013 are downstream of plasma source 1001 and upstream of substrate 1015 and showerhead 1009. Inside process chamber 1003, a substrate 1015 rests on a platen (or stage) 1017. Platen 1017 may be fitted with a heating/cooling element. In some embodiments, platen 1017 is also configured for applying a bias to substrate 1015, though as described above, in many embodiments, only neutral species are used in the treatment. Low pressure is attained in reaction chamber 1003 via vacuum pump and conduit 1019.

In operation, a treatment process gas is introduced via gas inlet 1011 to the plasma source 1001. The gas introduced to the plasma source contains the chemically active species that will be activated in the plasma source to form a plasma. Gas inlet 1011 may be any type of gas inlet and may include multiple ports or jets. If the process gas includes multiple components gases, they may be pre-mixed or introduced separately into plasma source 1001. Plasma source 1001 is where the active species of the gas introduced to the source is generated to form a plasma. In FIG. 10B, an RF plasma source is shown with induction coils 1015. Induction coils 1015 are energized and the plasma is generated. The apparatus 1000 may include gas inlets 1013 upstream of the showerhead 1009 and downstream of the plasma source 1001. These may be optionally used, for example to mix an inert gas with the plasma. If present, gas inlets 1013 may be any type of gas inlets and may include multiple ports or jets to optimize mixing. Showerhead 1009 directs the plasma mixture into process chamber 1003 through showerhead holes 1021. There may be any number and arrangement of showerhead holes 1021 to maximize uniformity of the plasma in process chamber 1003. Showerhead assembly 1005 may have an applied voltage and terminate the flow of some or substantially all ions while allowing the flow of neutral species into process chamber 1003. As mentioned, substrate 1015 may be temperature controlled. The plasma may react with the substrate to chemically modify it as described above.

Figure 11:
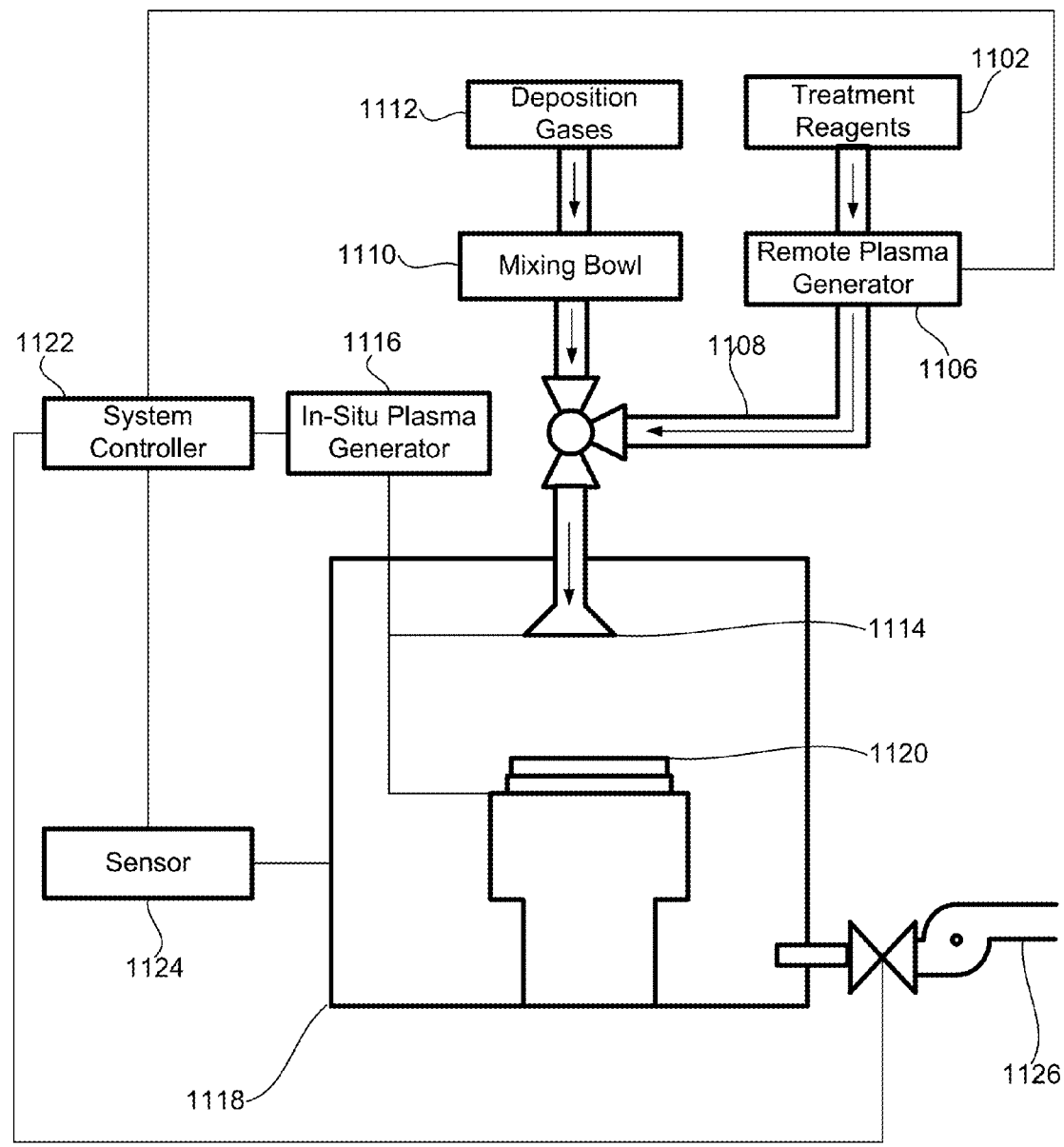

FIG. 11 is a schematic illustration of an apparatus 1100 suitable to practice the surface treatment methods of claimed invention. In this example, the apparatus 1100 may also be used for flowable dielectric deposition. The apparatus 1100 includes a processing chamber 1118 and a remote plasma generator 1106. The processing chamber 1118 includes a pedestal 1120, a showerhead 1114, a control system 1122 and other components described below. In the example of FIG. 11, the apparatus 1100 also includes a RF generator 1116, though this may not be present in some embodiments.

Treatment reagents, such as $H_2$, $H_2O$, $O_2$, and the like and inert or carrier gases, such as $N_2$, Ar, He, and others, are supplied to the remote plasma generator 1106 from various treatment reagent sources, such as source 1102. A treatment reagent source may be a storage tank containing one or a mixture of reagents. Moreover, a facility wide source of the reagents may be used.

Any suitable remote plasma generator may be used. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used An RPC unit is typically a self-contained device generating weakly ionized plasma using the supplied cleaning reagents. Imbedded into the RPC unit a high power RF generator provides energy to the electrons in the plasma. This energy is then transferred to the neutral cleaning reagent molecules leading to temperature in the order of 2000K resulting in thermal dissociation of the cleaning reagents. An RPC unit may dissociate more than 90% of incoming cleaning reagent molecules because of its high RF energy and special channel geometry causing the cleaning reagents to adsorb most of this energy.

The treatment reagent mixture is then flown through a connecting line 1108 into the processing chamber 1118, where the mixture is distributed through the showerhead 1114 to treat the wafer or other substrate on the pedestal 1120.

The chamber 1118 may include sensors 1124 for sensing various materials and their respective concentrations, pressure, temperature, and other process parameters and providing information on reactor conditions during the process to the system controller 1122. Examples of chamber sensors that may be monitored during the process include mass flow controllers, pressure sensors such as manometers, and thermocouples located in pedestal. Sensors 1124 may also include an infra-red detector or optical detector to monitor presence of gases in the chamber. Volatile byproducts and other excess gases are removed from the reactor 1118 via an outlet 1126 that may include a vacuum pump and a valve.

In certain embodiments, a system controller 1122 is employed to control process conditions during the treatment and/or subsequent deposition. The system controller 1122 will typically include one or more memory devices and one or more processors. The processor may include a CPU or computer, analog and/or digital input/output connections, stepper motor controller boards, etc. Typically there will be a user interface associated with system controller 1122. The user interface may include a display screen, graphical software displays of the apparatus and/or process conditions, and user input devices such as pointing devices, keyboards, touch screens, microphones, etc.

In certain embodiments, the system controller 1122 may also control all of the activities during the process, including gas flow rate, chamber pressure, generator process parameters. The system controller 1122 executes system control software including sets of instructions for controlling the timing, mixture of gases, chamber pressure, pedestal (and substrate) temperature, and other parameters of a particular process. The system controller may also control concentration of various process gases in the chamber by regulating valves, liquid delivery controllers and MFCs in the delivery system as well as flow restriction valves and the exhaust line. The system controller executes system control software including sets of instructions for controlling the timing, flow rates of gases and liquids, chamber pressure, substrate temperature, and other parameters of a particular process. Other computer programs stored on memory devices associated with the controller may be employed in some embodiments. In certain embodiments, the system controller controls the transfer of a substrate into and out of various components of the apparatuses.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The disclosed methods and apparatuses may also be implemented in systems including lithography and/or patterning hardware for semiconductor fabrication. Further, the disclosed methods may be implemented in a process with lithography and/or patterning processes preceding or following the disclosed methods. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

The invention claimed is:

1. A method comprising:
prior to flowable dielectric deposition on a substrate surface, performing a multi-step treatment, the multi-step treatment including a first operation of exposing the substrate surface to plasma species remotely generated from a hydrogen-containing reducing process gas to form Si—H terminated groups on the substrate surface and a second operation of exposing the Si—H terminated groups on the substrate surface to the plasma species remotely generated from a hydrogen-containing oxidizing process gas, wherein the second operation is performed after the first operation and the multi-step treatment results in a hydroxyl-terminated substrate surface.

2. The method of claim 1, wherein the substrate temperature during the multi-step treatment is between about −20° C. and 300° C.

3. The method of claim 1, wherein the substrate temperature during the multi-step treatment is between about −20° C. and 100° C.

4. The method of claim 1, wherein the hydrogen-containing reducing processing gas includes one or more of hydrogen ($H_2$), ammonia ($NH_3$), and hydrazine ($N_2H_2$).

5. The method of claim 4, wherein the hydrogen-containing oxidizing process gas includes one or more of water ($H_2O$) and hydrogen peroxide ($H_2O_2$).

6. The method of claim 1, wherein the hydrogen-containing oxidizing process gas includes a mixture of a hydrogen-containing compound and an oxygen-containing compound.

7. The method of claim 1, wherein the hydrogen-containing oxidizing process gas includes a compound having one or more hydroxyl (—OH) groups.

8. The method of claim 1, wherein the hydrogen-containing oxidizing process gas is a mixture of one or more of $H_2$, $NH_3$, $N_2H_2$ with one or more of oxygen ($O_2$), ozone ($O_3$), $H_2O$, $H_2O_2$, carbon dioxide ($CO_2$), and carbon monoxide (CO).

9. The method of claim 1, wherein the primary reactive species in the first operation are hydrogen (H) radicals.

10. The method of claim 1, wherein the hydrogen-containing reducing process gas includes substantially no oxygen.

11. The method of claim 1, further comprising exposing the substrate surface to a silicon-containing vapor phase precursor and a co-reactant to thereby deposit a flowable dielectric film on the substrate surface.

12. The method of claim 11, wherein the silicon-containing vapor phase precursor includes a silicon (Si)-carbon (C) bond.

13. The method of claim 11, wherein the silicon-containing vapor phase precursor includes a silicon-alkyl bond.

14. The method of claim 11, wherein the deposition occurs in the same chamber as the multi-step treatment.

15. The method of claim 11, wherein the deposition occurs in a different chamber as the multi-step treatment.

16. The method of claim 15, wherein the substrate is exposed to air between the multi-step treatment and the deposition.

17. The method of claim 1, wherein multi-step treatment is performed without forming an oxide interface layer greater than 20 Å thick.

18. The method of claim 1, wherein the substrate temperature during the multi-step treatment is between about −10° C. and 10° C.

19. A method comprising:
prior to flowable dielectric deposition on a substrate surface, performing a multi-step treatment, the multi-step treatment including a first operation of exposing the substrate surface to a reducing environment and a second operation of exposing the substrate surface to an oxidizing environment, wherein the multi-step treatment results in a hydroxyl-terminated substrate surface.

20. The method of claim 19, wherein the substrate temperature during the multi-step treatment is between about −10° C. and 10° C.

21. The method of claim 19, wherein the first operation forms Si—H terminated groups on the substrate surface and the second operation exposes the Si—H terminated groups to an oxidizing environment.

* * * * *